US012745428B2

(12) United States Patent
Rachmady et al.

(10) Patent No.: US 12,745,428 B2
(45) Date of Patent: Sep. 22, 2026

(54) 3D SOURCE AND DRAIN CONTACTS TUNED FOR VERTICALLY STACKED PMOS AND NMOS

(71) Applicant: Intel Corporation, Santa Clara, CA (US)

(72) Inventors: Willy Rachmady, Beaverton, OR (US); Nitesh Kumar, Beaverton, OR (US); Jami A. Wiedemer, Scappoose, OR (US); Cheng-Ying Huang, Hillsboro, OR (US); Marko Radosavljevic, Portland, OR (US); Mauro J. Kobrinsky, Portland, OR (US); Patrick Morrow, Portland, OR (US); Rohit Galatage, Hillsboro, OR (US); David N. Goldstein, Beaverton, OR (US); Christopher J. Jezewski, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 177 days.

(21) Appl. No.: 17/833,050

(22) Filed: Jun. 6, 2022

(65) Prior Publication Data

US 2023/0395718 A1 Dec. 7, 2023

(51) Int. Cl.
*H10D 30/69* (2025.01)
*H10D 30/01* (2025.01)
(Continued)

(52) U.S. Cl.
CPC ....... *H10D 30/794* (2025.01); *H10D 30/0198* (2025.01); *H10D 30/6735* (2025.01);
(Continued)

(58) Field of Classification Search
CPC ....... H10D 30/62–6759; H10D 30/794; H10D 84/017; H10D 84/832; H10D 84/851;
(Continued)

(56) References Cited

U.S. PATENT DOCUMENTS 8,901,672 B1 12/2014 Cheng et al.
2012/0074502 A1 * 3/2012 Ellis-Monaghan .......................... H10D 84/0167 257/E21.598

(Continued)

OTHER PUBLICATIONS

Partial European Search Report received for EP application No. 24210233.3. dated Apr. 15, 2025. 16 pages.

(Continued)

*Primary Examiner* — William B Partridge
*Assistant Examiner* — Alexandre X Ramirez
(74) *Attorney, Agent, or Firm* — Arcane Law PLLC

(57) ABSTRACT

An integrated circuit structure includes a vertical stack including a first device, and a second device above the first device. The first device includes (i) a first source and first drain region, (ii) a first body laterally between the first source and drain regions, (iii) a first source contact including a first conductive material, and (iv) a first drain contact including the first conductive material. The second device includes (i) a second source and second drain region, (ii) a second body laterally between the second source and drain regions, (iii) a second source contact including a second conductive material, and (iv) a second drain contact including the second conductive material. In an example, the first and second conductive materials are compositionally different. In an example, the first conductive material induces compressive strain on the first body, and the second conductive material induces tensile strain on the second body.

20 Claims, 23 Drawing Sheets

(51) Int. Cl.

| | |
|---|---|
| ***H10D 30/67*** | (2025.01) |
| ***H10D 62/10*** | (2025.01) |
| ***H10D 64/23*** | (2025.01) |
| ***H10D 64/62*** | (2025.01) |
| ***H10D 84/01*** | (2026.01) |
| ***H10D 84/85*** | (2025.01) |

(52) U.S. Cl.

CPC ......... *H10D 30/791* (2025.01); *H10D 62/118* (2025.01); *H10D 62/121* (2025.01); *H10D 64/256* (2025.01); *H10D 64/62* (2025.01); *H10D 84/0186* (2025.01); *H10D 84/85* (2025.01)

(58) Field of Classification Search

CPC ....... H10D 84/0153; H10D 30/43–509; H10D 84/85–859; H10D 64/254–258; H10D 84/0165–0195; H10D 88/00; H10D 64/2527; H10D 64/2523; H10D 64/252; H10D 30/797; H10D 30/0198; H10D 62/119–123

See application file for complete search history.

(56) References Cited

U.S. PATENT DOCUMENTS

| | | | | |
|---|---|---|---|---|
| 2013/0105907 | A1 | 5/2013 | Yin et al. | |
| 2014/0008606 | A1* | 1/2014 | Hussain | H10D 64/257 438/306 |
| 2014/0084377 | A1 | 3/2014 | Zhang et al. | |
| 2017/0117275 | A1 | 4/2017 | Shen et al. | |
| 2019/0131396 | A1* | 5/2019 | Zhang | B82Y 10/00 |
| 2020/0105871 | A1 | 4/2020 | Glass et al. | |
| 2020/0266271 | A1* | 8/2020 | Lin | H10D 64/017 |
| 2021/0249401 | A1* | 8/2021 | Shiraki | H10D 88/00 |
| 2021/0265348 | A1* | 8/2021 | Xie | H10D 64/015 |
| 2022/0130865 | A1 | 4/2022 | Park et al. | |
| 2022/0344496 | A1 | 10/2022 | Su et al. | |
| 2023/0014998 | A1 | 1/2023 | Ju et al. | |
| 2023/0095007 | A1 | 3/2023 | Mehandru et al. | |
| 2023/0282748 | A1* | 9/2023 | Mochizuki | H10D 64/017 257/347 |
| 2023/0307296 | A1* | 9/2023 | Xie | H10D 30/43 |
| 2023/0395717 | A1* | 12/2023 | Rachmady | H10D 30/6757 |
| 2023/0395718 | A1* | 12/2023 | Rachmady | H10D 84/85 |

OTHER PUBLICATIONS

Yoon, et al., "High-temperature stability of molybdenum (Mo) back contacts for CIGS solar cells: a route towards more robust back contacts," Journal of Physics D: Applied Physics 44 (2011) 425302. 7 pages.

Extended European Search Report received for EP application No. 24210233.3. dated Jul. 3, 2025. 17 pages.

U.S. Appl. No. 17/833,045, filed Jun. 6, 2022. 47 pages.

* cited by examiner

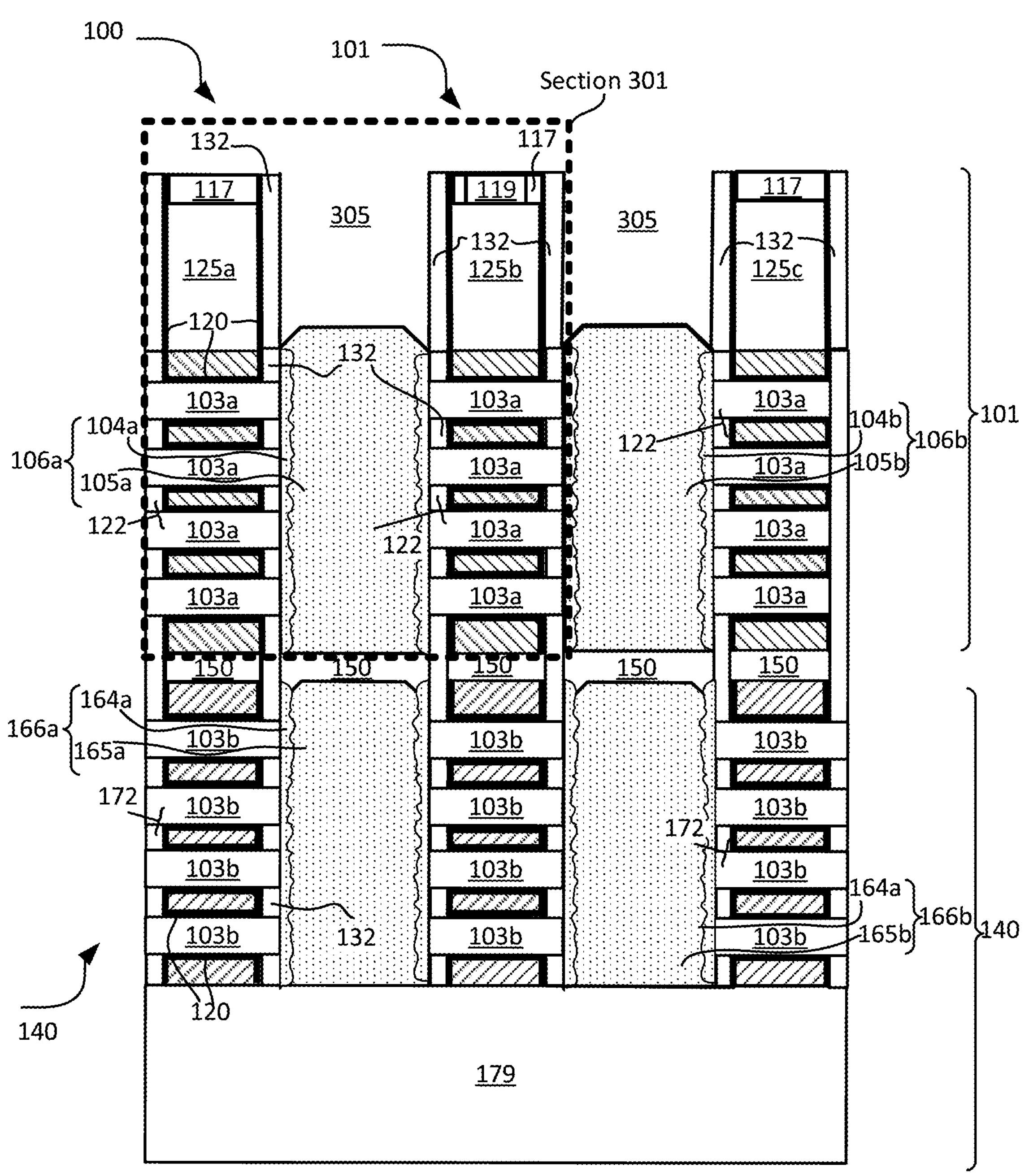
FIG. 3A1

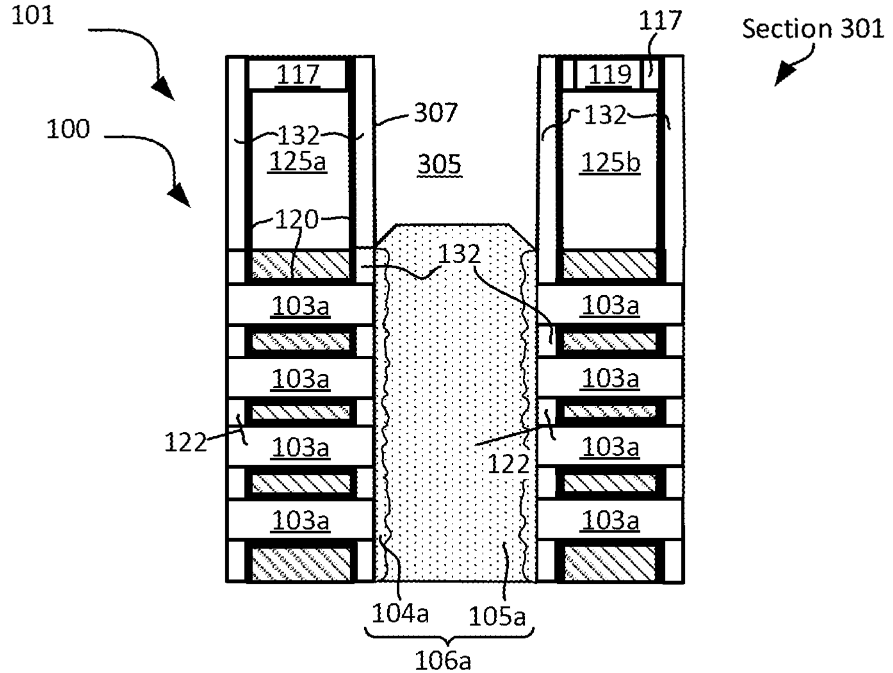
FIG. 3A2

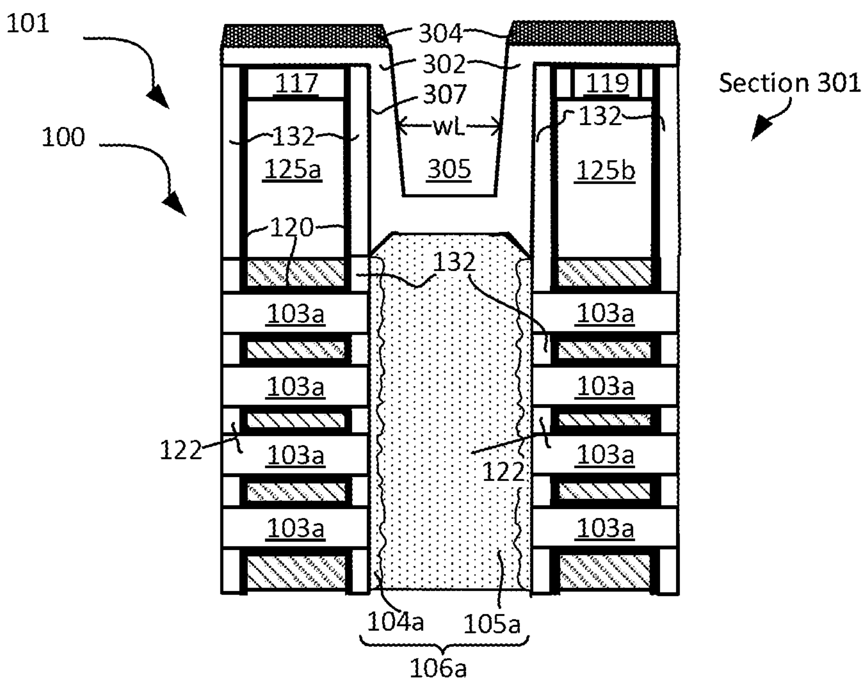
FIG. 3B1
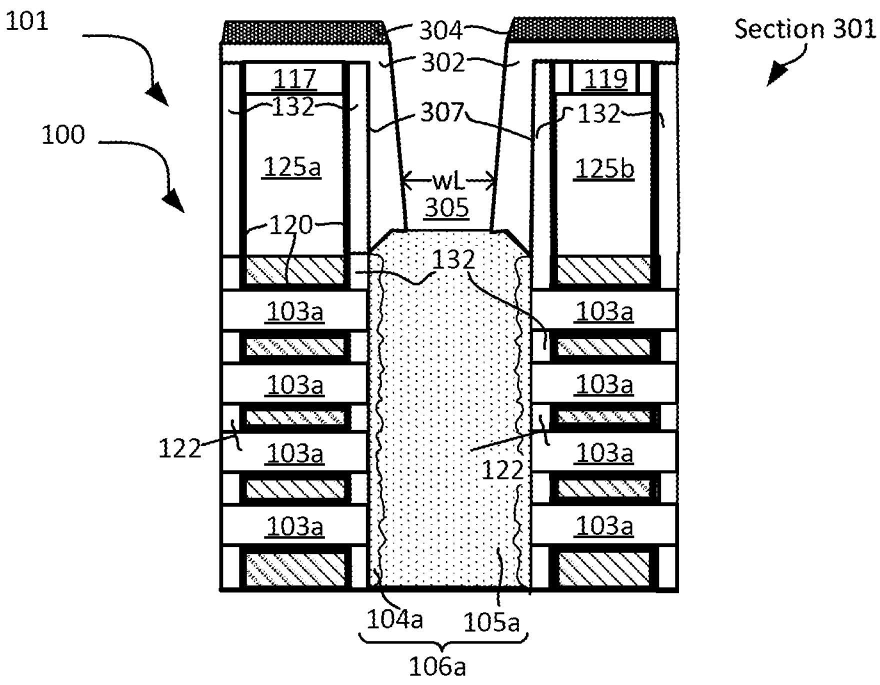
FIG. 3B2

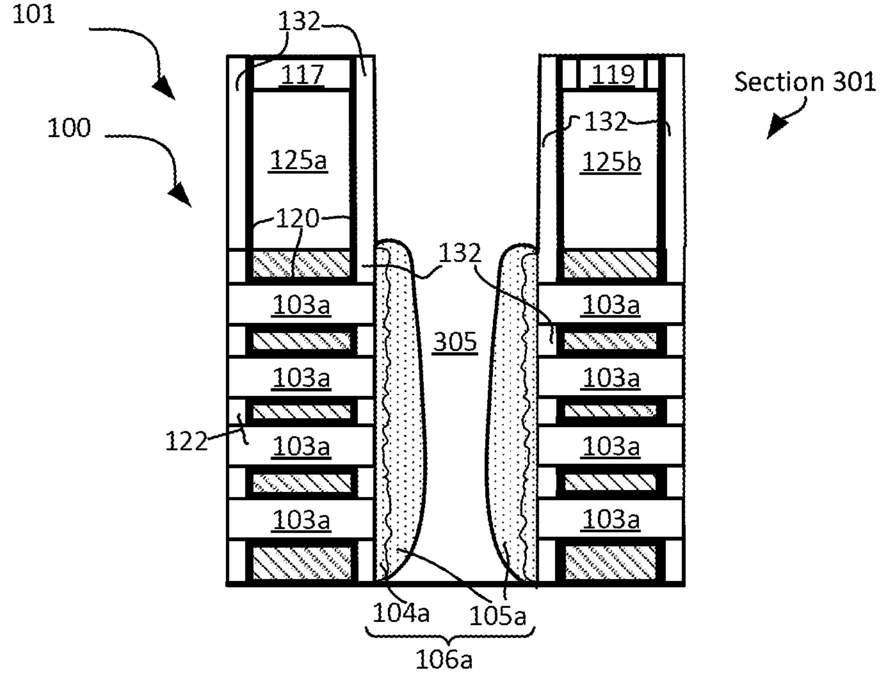
FIG. 3D1

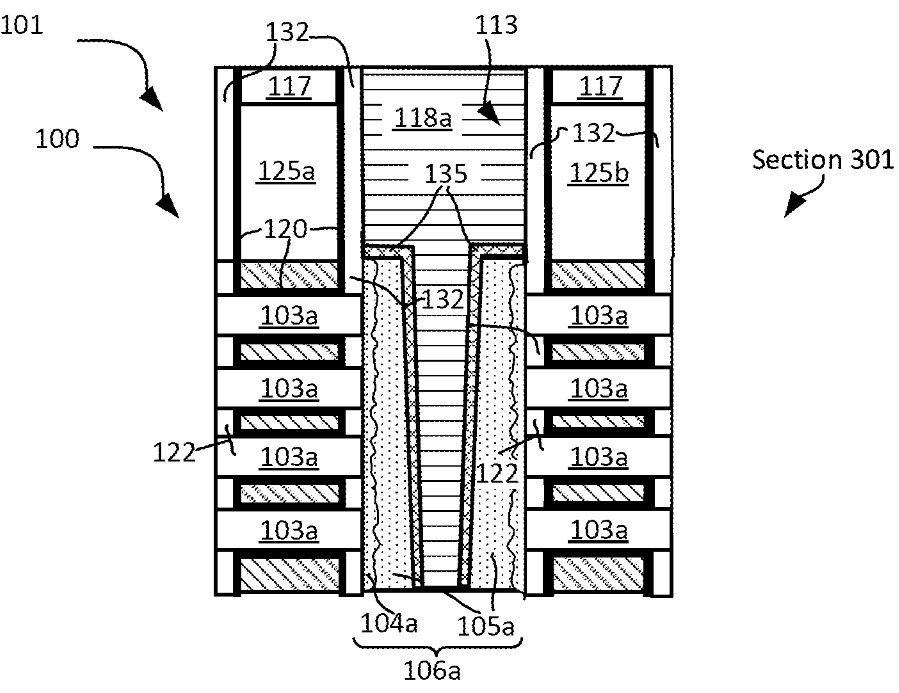
FIG. 3F1
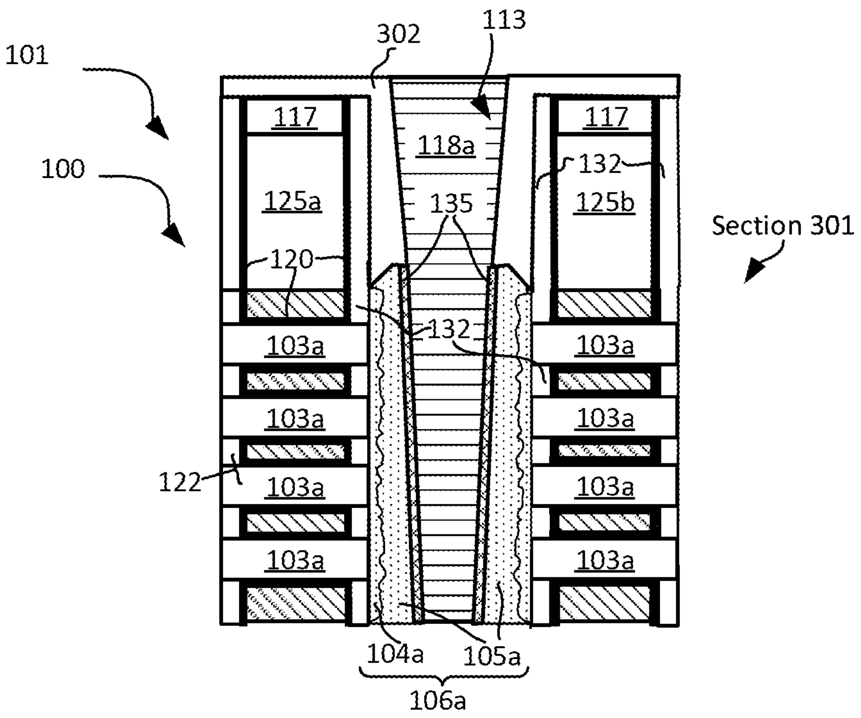
FIG. 3F2

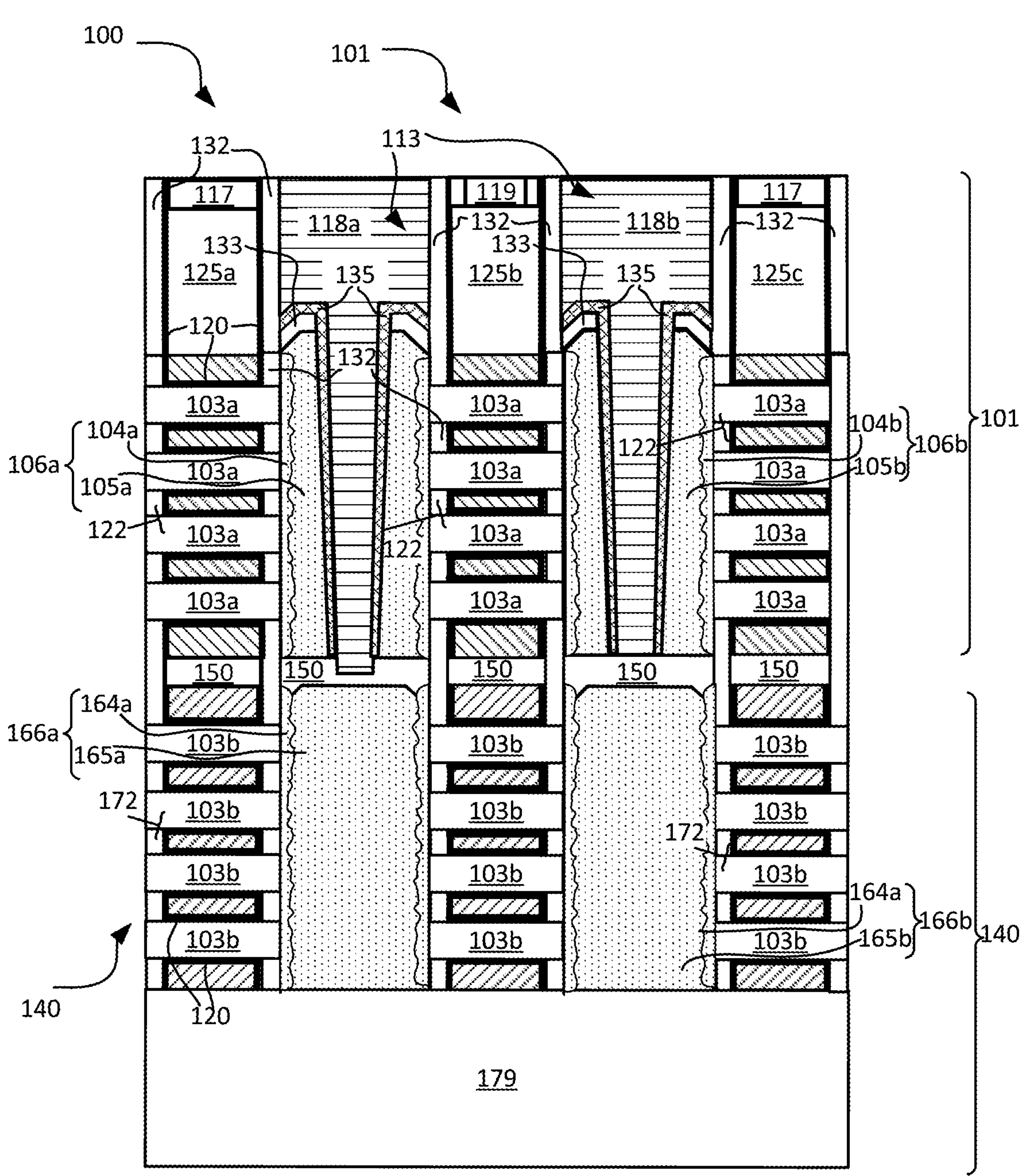
FIG. 3G1

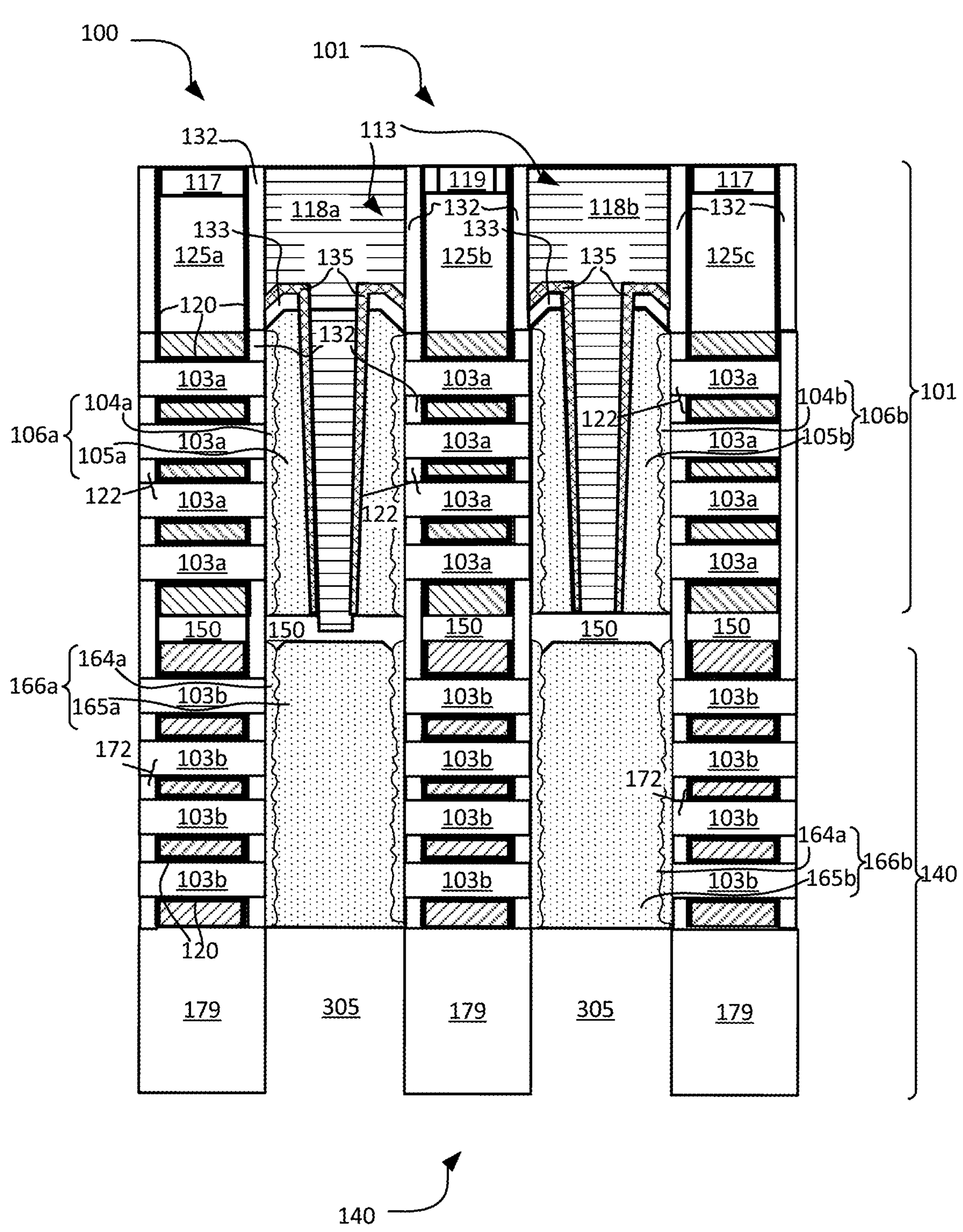
FIG. 3H1

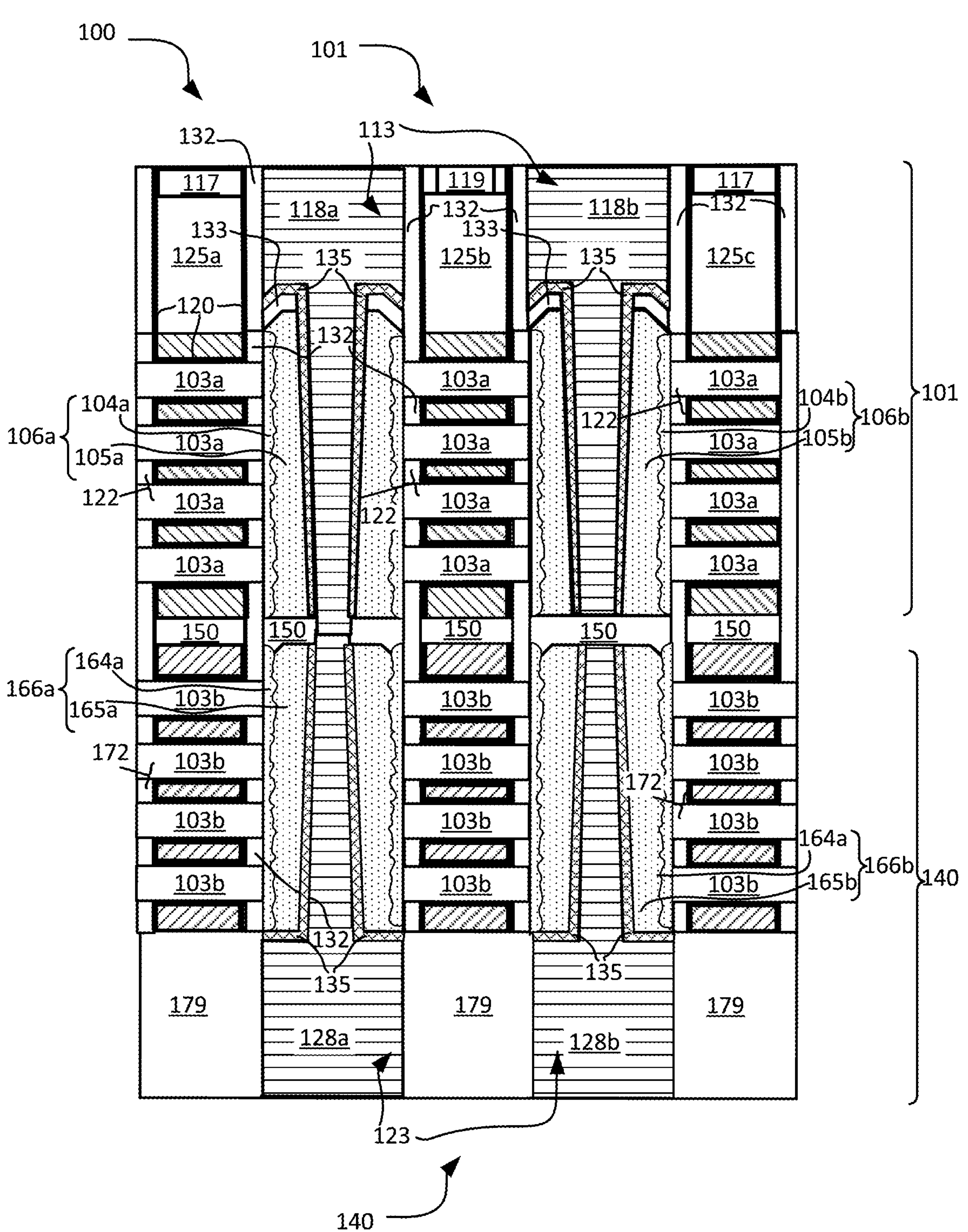
FIG. 3I1

3D SOURCE AND DRAIN CONTACTS TUNED FOR VERTICALLY STACKED PMOS AND NMOS

FIELD OF THE DISCLOSURE

The present disclosure relates to integrated circuits, and more particularly, to three-dimensional (3D) contact structures in vertically stacked devices.

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device; and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A gate-all-around (GAA) transistor (sometimes referred to as a nanoribbon or nanowire transistor) is configured similarly to a fin-based transistor, but instead of a finned channel region, one or more channel bodies such as nanoribbons or nanowires extend between the source and the drain regions. In GAA transistors, the gate material wraps around each nanoribbon (hence, gate-all-around).

Figure 1A:
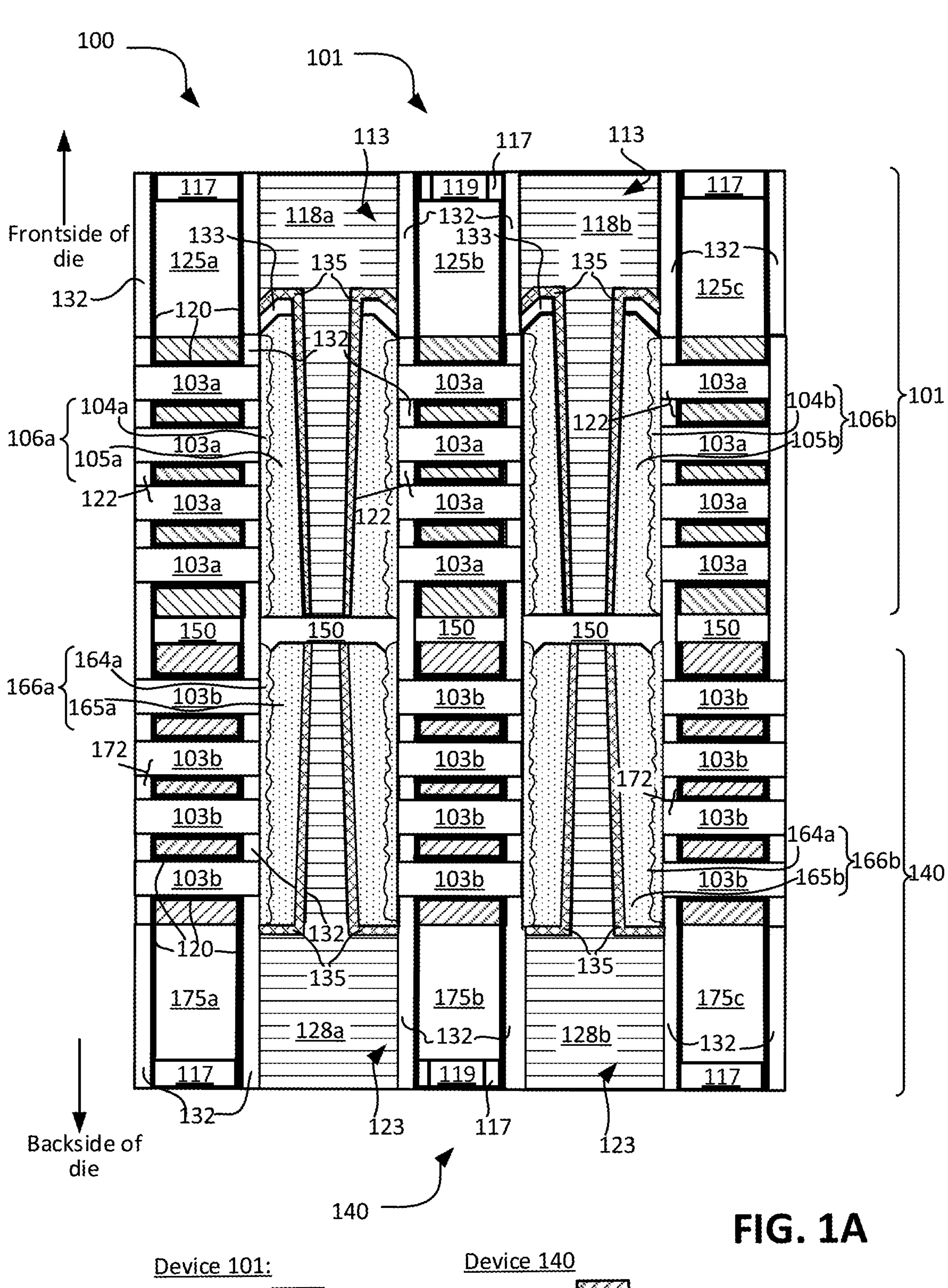
FIG. 1A illustrates a cross-section view of an integrated circuit structure including a vertically stacked architecture having a first device above a second device, wherein the integrated circuit structure comprises (i) a first conductive material for a first source contact and a first drain contact of the first device and (ii) a second conductive material for a second source contact and a second drain contact of the second device, wherein the first conductive material facilitates inducing a first type of strain in first channel region of the first device, and wherein the second conductive material facilitates inducing a second type of strain in second channel region of the second device, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

A three-dimensional (3D) contact architecture is disclosed that employs a first conductive material for source and drain contacts of a first device, and a second conductive material for source and drain contacts of second device, where the first device and the second device are arranged in a vertical stack. In an example, the first device is a p-channel metal-oxide semiconductor (PMOS) device, and the second device is an n-channel metal-oxide semiconductor (NMOS) device. The NMOS device may be, for example, above the PMOS device in the vertical stack, with an isolation structure between the two devices. The first and second conductive materials can be tuned to impart appropriate channel stress. In an example, the first conductive material of the source and drain contacts of a PMOS device induces compressive strain on a channel region of the PMOS device, and the second conductive material of the source and drain contacts of an NMOS device induces tensile strain on a channel region of the NMOS device. In some specific such examples, the first conductive material inducing the compressive strain within the PMOS channel region comprises one or both of tungsten and cobalt, and the second conductive material inducing the tensile strain within the NMOS channel region comprises molybdenum. In one embodiment, an integrated circuit structure includes a vertical stack of devices comprising a first device, and a second device above the first device. The first device comprises (i) a first source region, (ii) a first drain region, (iii) a first body comprising semiconductor material laterally extending from the first source region to the first drain region, (iv) a first source contact coupled to the first source region, and (v) a first drain contact coupled to the first drain region. In an example, the first source contact and the first drain contact comprise a first conductive material. The second device comprises (i) a second source region, (ii) a second drain region, (iii) a second body comprising semiconductor material laterally extending from the second source region to the second drain region, (iv) a second source contact coupled to the second source region, and (v) a second drain contact coupled to the second drain region. In an example, the second source contact and the second drain contact comprise second conductive material. In an example, the first conductive material is elementally different or otherwise compositionally from the second conductive material. In an example, the first device is a PMOS device and the first conductive material comprises one or both of tungsten and cobalt. In an example, the second device is an NMOS device and the second conductive material comprises molybdenum. In an example, the first conductive material induces compressive strain on the first body of the first device, and the second conductive material induces tensile strain on the second body of the second device. Thus, the first and second conductive materials are appropriately selected, to impart appropriate channel stress within the first and second devices.

In another embodiment, an integrated circuit structure comprises a first transistor device and a second transistor device. The first transistor device includes a first source or drain contact coupled to a corresponding first source or drain region. The second transistor device includes a second source or drain contact coupled to a corresponding second source or drain region. In an example, the first source or drain contact comprises one or both of tungsten and cobalt. In an example, the second source or drain contact comprises molybdenum. In an example, the first device and the second device are arranged in a vertical device stack. For example, the second device is above the first device in the vertical device stack, and the first transistor device and the second transistor device are coupled in a complementary metal oxide semiconductor (CMOS) architecture. In an example, the first transistor device is a PMOS device, and the second transistor device is an NMOS device.

In yet another embodiment, an integrated circuit structure comprises a first device and a second device arranged in a vertical device stack. The first device comprises (i) a first source region, (ii) a first drain region, (iii) a first nanoribbon laterally extending from the first source region to the first drain region, and (iv) a first source contact extending within the first source region. The second device comprises (i) a second source region, (ii) a second drain region, (iii) a second nanoribbon laterally extending from the second source region to the second drain region, and (iv) a second source contact extending within the second source region. In an example, the first source contact induces compressive strain within the first nanoribbon, and the second source contact induces tensile strain within the second nanoribbon. In an example, the first device is a PMOS device, and the second device is an NMOS device. Numerous configurations and variations will be apparent in light of this disclosure.

General Overview

Field effect transistors (FETs) have been scaled to smaller and smaller sizes. Such scaling has resulted in the development of gate-all-around (GAA) transistors, examples of which include nanowire or nanoribbon transistors. For example, the GAA channel region can have a vertical stack of nanoribbons that extend horizontally between the source and drain regions, and a gate structure that is between the source and drain regions and wraps around the nanoribbons. It is difficult to obtain strain in a nanoribbon channel and is even more challenging for stacked transistor architecture having first and second transistors arranged in a vertical stack. Exacerbating this problem is that PMOS and NMOS devices have opposite strain requirements.

Accordingly, techniques are provided herein to form an IC that includes a vertically stacked GAA device architecture having an upper device above a lower device, where channel regions of the upper and lower devices are appropriately strained to improve performance of the upper and lower devices. For example, one of the upper or lower devices is a PMOS device, and the other of the upper or lower devices is an NMOS device, where the vertically stacked PMOS and NMOS devices may be coupled in a CMOS architecture. In an example, to improve performance of PMOS and NMOS devices, the channel regions of the PMOS and NMOS devices may be strained differently. In an example, increased compressive strain on channel region of the PMOS device improves hole mobility within the channel region, resulting in better performance of the PMOS device. On the other hand, increased tensile strain on channel region of the NMOS device improves electron mobility within the channel region, resulting in better performance of the NMOS device. Thus, in one embodiment, in the vertical stack of devices, conductive material of the source and drain contacts of the PMOS device is appropriately selected, so as to impart compressive strain on the channel region of the PMOS device, thereby improving performance of the PMOS device. Similarly, conductive material of the source and drain contacts of the NMOS device is appropriately selected, so as to impart tensile strain on the channel region of the PMOS device, thereby improving performance of the NMOS device.

In an example, in the vertical device stack, to maintain the relatively large source and drain contacts in individual devices, the source and drain contacts of individual devices of the vertical stack effectively extend into the source and drain regions, respectively. For example, a source contact extends within a corresponding source region or between non-merged left and right epitaxial portions of a corresponding source region, and a drain contact extends within a corresponding drain region or between non-merged left and right epitaxial portions of a corresponding drain region, thereby making the contact area between the source contact and the source region (or between the drain contact and the drain region) relatively large, which results in the contact resistance being relatively lower. Such contacts are referred to herein as three-dimensional (3D) contacts. With such 3D architecture of the source and drain contacts, the source and drain contacts are now relatively closer to the channel region (which may comprise one or more nanoribbons, for example) of the GAA device. Note that an example of the channel region in a GAA device includes nanoribbons. As will be appreciated in light of this disclosure, reference to nanoribbons as channel regions is also intended to include other gate-all-around or multi-gate channel regions, such as nanowires, nanosheets, and other such semiconductor bodies. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets or some other body around which a gate structure can at least partially wrap (such as the semiconductor bodies of a forksheet device or a fin-based device).

Continuing with the above discussion regarding embedded 3D architecture of the source and drain contacts, the source and drain contacts may be relatively close to the channel region of the device. For example, a lateral distance between the source contact (or drain contact) and the channel region may be in the range of 2-16 nanometers. Because of such close proximity between the source and drain contacts and the channel region, the stress of the contact material may be imparted as strain within the corresponding channel region.

Some source and drain contact material may impart or induce compressive strain within the channel region, while some other source and drain contact material may impart or induce tensile strain within the channel region. For example, tungsten and cobalt may try to expand after deposition within the source or drain region, thereby inducing compressive strain within the adjacent channel region. In another example, molybdenum may try to contract after deposition within the source or drain region, thereby inducing tensile strain within the adjacent channel region.

As discussed herein above, increased compressive strain on channel regions (e.g., nanoribbons) of a PMOS device improves hole mobility within the nanoribbons, resulting in better performance of the PMOS device. On the other hand, increased tensile strain on nanoribbons of a NMOS device improves electron mobility within the nanoribbon, resulting in better performance of the NMOS device. Accordingly, in a CMOS architecture (or another appropriate architecture) that includes the vertically stacked PMOS and NMOS devices, the source and drain contacts of the PMOS devices include conductive materials such as tungsten and/or cobalt (e.g., and lack molybdenum), which induces compressive strain on the channel region (such as nanoribbons) of the PMOS devices, thereby improving performance of the PMOS devices. On the other hand, the source and drain contacts of the NMOS devices include conductive materials such as molybdenum (e.g., and lack tungsten and/or cobalt), which induces tensile strain on the channel region (such as nanoribbons) of the NMOS devices, thereby improving performance of the NMOS devices. Thus, the source and drain contact metals for NMOS and PMOS devices are tuned and selected independently, to achieve desired strain characteristics within the respective devices (e.g., compressive strain with channel regions of the PMOS device, and tensile strain with channel regions of the NMOS device).

In an example, to form the above discussed source and drain contacts having appropriately selected conductive material (to achieve desired strain characteristics within the respective devices) in the vertical device stack, the source and drain contacts of the upper device are formed from the frontside of the wafer, and the source and drain contacts of the lower device are formed from the backside of the wafer. For example, at least a part of individual devices of the stacked device architecture is formed, with each of the upper device and the lower device having corresponding source and drain regions covered by respective dielectric material. The source and drain regions of the upper device is initially opened, e.g., by removing the dielectric material covering the source and drain regions of the upper device (without opening the source and drain regions of the lower device). Subsequently, a layer of liner (e.g., see FIGS. 3B1 and 3B2) is formed on walls of gate spacers and partially above the source and drain regions of the upper device. The liner defines a recess or opening above a top surface of each of source and drain source regions of the upper device. In an example, a thickness or width of the liner dictates a width of the opening, which in turn dictates the width of the source and drain contacts of the upper device to be eventually formed. In an example, the liner is etch-selective with respect to the material of the source and drain regions of the upper device. For example, an etch process that etches a source region of the upper device may not substantially etch (or etch at a substantially slower rate) the liner. In some examples, a protective layer may also be deposited on top surfaces of the liner, which acts as a "helmet" in the sense that it protects the liner, e.g., when the recess within the source and drain regions are formed. Subsequently, portions of the source and drain regions of the upper device is removed through the respectively opening defined by the respectively liner, so as to extend the opening within the respectively source and regions of the upper device (e.g., as illustrated in FIG. 3C). A selective anisotropic or directional etch may be performed, such that a rate of etching the source or drain region is substantially faster than a rate of etching the liner and/or the protective layer. Accordingly, after the etch process, the liner and the protective layer continue to cover the walls of the gate spacer and the gate electrode.

Subsequently, the protective layer and the liner are removed. In some examples, some remnants of the liner may be present on sidewalls of the gate spacers and/or above a portion of the source or drain regions. Subsequently, one or more lining layers (e.g., comprising one or more silicide layer(s), germanide layer(s), and/or adhesive layer(s)) are formed in the openings within the source and regions of the upper device. Finally, first conductive material may be deposited within the respective openings extending within the source region and the drain region of the upper device, to respectively form the source contact and drain contact of the upper device. In an example, the upper device is an NMOS device and the first conductive material, which induces tensile strain on the nanoribbons of the device NMOS, may include molybdenum or an alloy thereof, for example. In an example, the conductive materials of the source and drain contacts may be planarized using an appropriate planarization technique, such as mechanical polishing or chemical mechanical polishing (CMP). In an example, when the first conductive material is deposited within the opening within the source region and the drain region of the NMOS device, the source region and the drain region of the lower device are still covered by dielectric material.

Once the source and drain contacts of the upper device is formed, the structure is flipped upside-down and the source and drain contacts of the lower device is formed in a similar manner in which the source and drain contacts of the upper device were formed. However, in the lower device, a second conductive material (e.g., instead of the first conductive material) may be deposited within the respective openings extending within the source region and the drain region, to respectively form the source contact and drain contact of the lower device. In an example, the lower device is a PMOS device and the second conductive material, which induces compressive strain on the nanoribbons of the device PMOS, may include tungsten and/or cobalt, or an alloy thereof, for example. In an example, the conductive materials may be planarized using an appropriate planarization technique, such as mechanical polishing or CMP. This completes formation of the source and drain contacts of the upper and lower devices.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools be used to detect a vertical stack of a PMOS device and an NMOS device, with the NMOS device having source and drain contacts comprising a first conductive material, and the PMOS device having source and drain contacts comprising a second conductive material, where the first conductive material (e.g., molybdenum) is elementally different or otherwise compositionally from the second conductive material (e.g., tungsten and/or cobalt). In an example, the NMOS device is above the PMOS device in the vertical stack, although in another example the PMOS device may be above the NMOS device. Such tools may also detect channel regions of the NMOS device being in tensile strain that is induced by the first conductive material of the source and drain contacts of the NMOS device, and channel regions of the PMOS device being in compressive strain that is induced by the second conductive material of the source and drain contacts of the PMOS device. Numerous configurations and variations will be apparent in light of this disclosure.

Architecture

FIG. 1A illustrates a cross-section view of an integrated circuit structure 100 (also referred to herein as "structure 100") including a vertically stacked architecture having a first device 101 above a second device 140, wherein the integrated circuit structure 100 comprises (i) a first conductive material 113 for a first source contact 118*a* and a first drain contact 118*b* of the first device 101 and (ii) a second conductive material 123 for a second source contact 128*a* and a second drain contact 128*b* of the second device 140, wherein the first conductive material 113 facilitates inducing a first type of strain in first channel region 103*a* of the first device 101, and wherein the second conductive material 123 facilitates inducing a second type of strain in second channel region 103*b* of the second device 140, in accordance with an embodiment of the present disclosure.

As can be seen, the cross-section of FIG. 1 is taken parallel to, and through, the fin structure, such that the channel, source, and drain regions are shown. This particular cross-section includes three channel regions along with a source region and a drain region for each device, but any number of channel regions and corresponding source and drain regions can be included, as will be appreciated. Further note that all devices shown in this example are contacted, but other examples may include dummy devices or devices that are not connected into the overall circuit. The semiconductor bodies 103*a* and 103*b* included in the channel regions of the devices 101 and 140, respectively, can vary in form, but in this example embodiment are in the form of nanoribbons. In particular, the channel regions of the upper device 101 in this example case include a first set of four nanoribbons 103*a*, and the channel regions of the lower device 140 include a second set of four nanoribbons 103*b*. Other examples may include fewer nanoribbons per channel region (e.g., one or two), or more nanoribbons per channel region (e.g., five or six). Still other embodiments may include other channel configurations, such as one or more nanowires or a fin or other semiconductor body, including both planar and nonplanar topologies. To this end, the present disclosure is not intended to be limited to any particular channel configuration or topology; rather the techniques provided herein can be used in any transistor architecture that uses complementary type of adjacent transistors.

The device configuration includes vertically stacked devices 101 and 140, where the upper device 101 is above the lower device 140. In the example of FIG. 1A, the upper device 101 includes a source region 106*a* and a drain region 106*b*, each adjacent to a gated channel region on either side. Other embodiments may not have gated channel regions to each side, such as the example case where only the channel region between source region 106*a* and drain region 106*b* is present. The lower device 140 includes a source region 166*a* and a drain region 166*b*, each adjacent to a gated channel region on either side. Other embodiments may not have gated channel regions to each side, such as the example case where only the channel region between source region 166*a* and drain region 166*b* is present. Note that in an example, the location of the source and drain regions in one or both devices may be interchanged.

In an example, the source region 106*a* of the upper device 101 comprises a nucleation region 104*a*, and a region 105*a* that may be epitaxially formed or formed otherwise. Similarly, the drain region 106*b* of the upper device 101 comprises a nucleation region 104*b*, and a region 105*b* that may be epitaxially formed or formed otherwise. In an example, the source region 166*a* of the lower device 140 comprises a nucleation region 164*a*, and a region 165*a* that may be epitaxially formed or formed otherwise. Similarly, the drain region 166*b* of the lower device 140 comprises a nucleation region 164*a*, and a region 165*b* that may be epitaxially formed or formed otherwise. In some examples, the nucleation regions may be absent. Numerous source and drain configurations can be used, and the present disclosure is not intended to be limited to any particular ones. In some example embodiments, the source and drain regions (e.g., the regions 105*a*, 105*b*, 165*a*, 165*b*) are epitaxial source and drain regions that are provided after the relevant portion of the fin or fin structure was isolated and etched away or otherwise removed. In other embodiments, the source/drain regions may be doped portions of the fin structure or substrate, rather than epi regions. In some embodiments using an etch and replace process, the epi source and drain regions are faceted and overgrown from a trench within insulator material (e.g., shallow trench isolation, or gate spacer 132 that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or OH), and the corresponding source or drain contact structure lands on that planarized portion. Source and drain contacts are discussed in further detail herein in turn.

The source and drain regions can be any suitable semiconductor material and may include any dopant scheme. In an example, in the source region 106*a*, the region 105*a* is more heavily doped than the corresponding nucleation region 104*a*; in the drain region 106*b*, the region 105*b* is more heavily doped than the corresponding nucleation region 104*b*; and so on. In an example, source and drain regions can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, PMOS source and drain regions are boron-doped SiGe, and NMOS source and drain regions are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

In one embodiment, each of gate structures 122 of the device 101 wraps around each of the nanoribbons 103*a* in the corresponding channel region. Gate spacers 132 isolates the gate structures 122 from contacting the source region 106*a* and the drain region 106*b*. In other embodiments, there may be other insulator layers (e.g., interlayer dielectric) that prevent such contact, whether in addition to the gate spaces 132, or in place of the gate spacers 132. In an example, frontside conductive gate contacts 125*a*, 125*b*, and 125*c* provide contacts to respective three gate structures 122 of the device 101. In an example, dielectric material 117 are above individual gate contacts 125*a*, 125*b*, 125*c*. Thus, in this example, none of the gate contacts 125*a*, 125*c* have been opened for being coupled to external circuit. In another example, the dielectric material 117 above one or more of the gate contacts may be opened, e.g., such that a conductive via, such as conductive via 119 over gate contact 125*b*, extends through the dielectric material 117 and contacts the corresponding gate contact 125*b*.

In one embodiment, each of gate structures 172 of the device 140 wraps around each of the nanoribbons 103*b* in the corresponding channel region. Gate spacers 132 isolates the gate structures 172 from contacting the source region 166*a* and the drain region 166*b*. In other embodiments, there may be other insulator layers (e.g., interlayer dielectric) that prevent such contact, whether in addition to the gate spaces 132, or in place of the gate spacers 132. In an example, backside conductive gate contacts 175*a*, 175*b*, and 175*c* provide contacts to respective three gate structures 172 of the device 101. In some embodiments, lower and/or upper interconnect structures may be present, to further route signals to and/or from the gate contacts 125, 175. Any number of suitable interconnects schemes can be used. In an example, dielectric material 117 are below individual gate contacts 175*a*, 175*b*, 175*c*. In an example, the dielectric material 117 below one or more of the gate contacts, such as gate contact 175*b*, may be opened, e.g., such that a conductive via 119 extends through the dielectric material 117 and contacts the corresponding gate contact 175*b*.

Each of gate structures 122, 172 can be formed via gate-first or gate-last processing, and may include any number of suitable gate materials and configurations. In an embodiment, each of the gate structures 122, 172 includes a corresponding gate electrode and a gate dielectric 120 between the gate electrode and the corresponding nanoribbons 10. In one example the gate spacers 132 may be considered part of the gate structure, whereas in another example the gate spacers 132 may be considered external to the gate structure.

Each of the gate structures 122 of the upper device 101 comprises a corresponding gate electrode 127 and corresponding dielectric material 120. Each of the gate structures 172 of the lower device 140 comprises a corresponding gate electrode 177 and corresponding dielectric material 120. The gate dielectric material 120 (shown with thick bolded lines) warps around middle section of individual nanoribbons 103 (note that end sections of individual nanoribbons 103 are wrapped around by the gate spacers 132). The gate dielectric material 120 is between individual nanoribbons 103 and corresponding gate electrode, as illustrated. In an example, due to conformal deposition of the gate dielectric material 120, the gate dielectric material 120 may also be on inner sidewalls of the gate spacers 132, as illustrated.

The gate dielectric 120 may include a single material layer or multiple stacked material layers. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 120 is lanthanum. In some embodiments, the gate dielectric can be annealed to improve its quality when high-k dielectric material is used. In some embodiments, the gate dielectric 120 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer.

In an example, the gate electrode 127 of the device 101 and the gate electrode 177 of the device 140 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example.

In one embodiment, one or more work function materials (not illustrated in FIG. 1) may be included around the nanoribbons 103. Note that work function materials are called out separately, but may be considered to be part of the gate electrodes. In this manner, a gate electrode may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons 103. In still other embodiments, there may be insufficient room for any gate fill material, after deposition of work function material (i.e., a given gate electrode may be all work function material and no fill material). Numerous gate structure configurations can be used along with the techniques provided herein, and the present disclosure is not intended to be limited to any particular such configurations.

The semiconductor bodies 103*a*, 103*b*, which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 103 may be fins on which the corresponding gate structures are formed to provide double-gate or tri-gate configurations (as opposed to gate-all-around configurations with nanoribbons or wires). The semiconductor bodies 103 may be lightly doped, or undoped, and may be shaped or sculpted during the gate formation process, according to some embodiments. In some cases, semiconductor bodies 103 may be a multilayer structure, such as a SiGe body cladded with germanium, or a silicon body cladded with SiGe. Any number of channel configurations can be used.

As can further be seen in FIG. 1A, isolation structure 150 isolates the upper device 101 from the lower device 140. For example, the isolation structure 150 prevents the gate structures 122 of the upper device 101 from contacting the gate structures 172 of the lower device 140. In an example, the isolation structure 150 is between upper gate electrode 127 of the upper device 101 and the lower gate electrode 177 of the lower device 140, as illustrated in FIG. 1A. However, in another example, the isolation structure 150 may be absent between an upper gate electrode 127 and a corresponding lower gate electrode 177, such that the upper and lower gate electrodes are electrically shorted, e.g., depending on a design of a circuit that includes the devices 101, 140.

In an example, the isolation structure 150 is also between the source region 106*a* of the upper device and the source region 166*a* of the lower device 140, and electrically isolates the two source regions. Similarly, the isolation structure 150 is also between the drain region 106*b* of the upper device and the drain region 166*b* of the lower device 140, and electrically isolates the two drain regions. In an example, the isolation structure 150 comprises dielectric material, e.g., one or more appropriate oxides, nitrides, carbides, oxynitrides, oxycarbides, and oxycarbonitrides. In some example embodiments, isolation structure 150 includes silicon, and one or more of oxygen, carbon, and nitrogen (e.g., silicon oxycarbide, or silicon oxycarbonitride). group IV material (e.g., silicon, germanium, or SiGe).

Referring to the left most-set of nanoribbons 103*a* of the upper device 101 (also referred to herein as left-upper nanoribbons 103*a*) and the left most-set of nanoribbons 103*b* of the upper device 101 (also referred to herein as left-upper nanoribbons 103*b*), the left-upper nanoribbons 103*a* and the left-lower nanoribbons 103*b* can be formed form the same fin structure. Similarly, other vertically adjacent sets of nanoribbons of the two devices 101, 40 can be formed from the same fin structure. Note that the top and bottom channel regions of the fin structure may be compositionally and/or structurally configured the same or differently, with respect to shape and/or semiconductor materials, and may further include fin-based channel regions, nanowire-based channel regions, or nanoribbon-based channel regions. For instance, the lower portion of the fin structure comprises, for example, SiGe or germanium suitable for PMOS devices interleaved with sacrificial material, and the upper portion of the fin structure comprise a group III-V semiconductor material such as indium gallium arsenide, indium arsenide, or gallium antimonide suitable for NMOS devices interleaved with sacrificial material. In another example embodiment, the lower channel region is configured with a first fin portion of the fin structure comprising a first semiconductor material (e.g., SiGe), and the upper channel region is configured with a second fin portion of the fin structure comprising a second semiconductor material (e.g., silicon) that is compositionally different from the first semiconductor material.

As illustrated in FIG. 1A, for the device 101, a source contact 118*a* extends within the source region 106*a*, and a drain contact 118*a* extends within the drain region 106*a*. Similarly, for the device 140, a source contact 128*a* extends within the source region 166*a*, and a drain contact 128*b* extends within the drain region 166*a*. In an example, the source contact 118*a* may fully extend within and extend through the source region 106*a*, such that the source contact 118*a* reaches and is in contact with isolation structure 150 between the source regions 106*a* and 166*a*. For example, a bottom surface of the source contact 118*a* and a bottom surface of the source region 106*a* may be coplanar.

Similarly, in an example, the drain contact 118*b* may fully extend within and extend through the drain region 106*b*, such that the drain contact 118*b* reaches and is in contact with isolation structure 150 between the drain regions 106*b* and 166*b*. For example, a bottom surface of the drain contact 118*b* and a bottom surface of the drain region 106*b* may be coplanar.

In an example, the source contact 128*a* may fully extend within and extend through the source region 166*a*, such that the source contact 128*a* reaches and is in contact with isolation structure 150 between the source regions 106*a* and 166*a*. For example, a bottom surface of the source contact 128*a* and a bottom surface of the source region 166*a* may be coplanar.

Similarly, in an example, the drain contact 128*b* may fully extend within and extend through the drain region 166*b*, such that the drain contact 128*b* reaches and is in contact with isolation structure 150 between the drain regions 106*b* and 166*b*. For example, a bottom surface of the drain contact 128*b* and a bottom surface of the drain region 166*b* may be coplanar.

In an example, a conductive lining layer 135 is between a source or drain contact and a corresponding source or drain region. For example, the conductive lining layer 135 is between the source contact 118*a* and the source region 106*a*, the conductive lining layer 135 is between the drain contact 118*b* and the drain region 106*b*, the conductive lining layer 135 is between the source contact 128*a* and the source region 166*a*, and the conductive lining layer 135 is between the drain contact 128*b* and the drain region 166*b*, as illustrated in FIG. 1. In an example, the conductive lining layer 135 is representative of one or more silicide layer(s), germanide layer(s), and/or adhesive layer(s) between the conductive source or drain metal contact and the adjacent source or drain region. In an example, the lining layer 135 reduces contact resistance of the source and drain contacts.

In an example and as illustrated in FIG. 1A, a layer of dielectric material 133 may be present between a section of a lower surface of an upper portion of the source contact 118*a* and a corresponding section of an upper surface of the source region 106*a*, where the upper portion of the source contact 118*a* is above the source region 106*a*. In an example and as illustrated in FIG. 1A, the layer of dielectric material 133 may also be present between a section of a lower surface of an upper portion of the drain contact 118*b* and a corresponding section of an upper surface of the drain region 106*b*, where the upper portion of the drain contact 118*b* is above the drain region 106*a*. In another example, the layers of dielectric material 133 may be absent from the device 101, in which case the lower surface of the upper portion of the conductive lining layer 135 may be on the upper surface of the source region 106*a* (e.g., similar to the structure illustrated for the device 140). The presence or absence of the layer of dielectric material 133 may be based on specific processes for forming the source and drain contacts. Note that the layers of dielectric material 133 are illustrated for the device 101, and not for the device 140. In an example, the layers of dielectric material 133 may be present in both devices 101, 140, may be present in any one of the devices 101, 140, or may be absent from both the devices 101, 140, e.g., based on the specific processes for forming the source and drain contacts of the two devices.

Figure 1B:
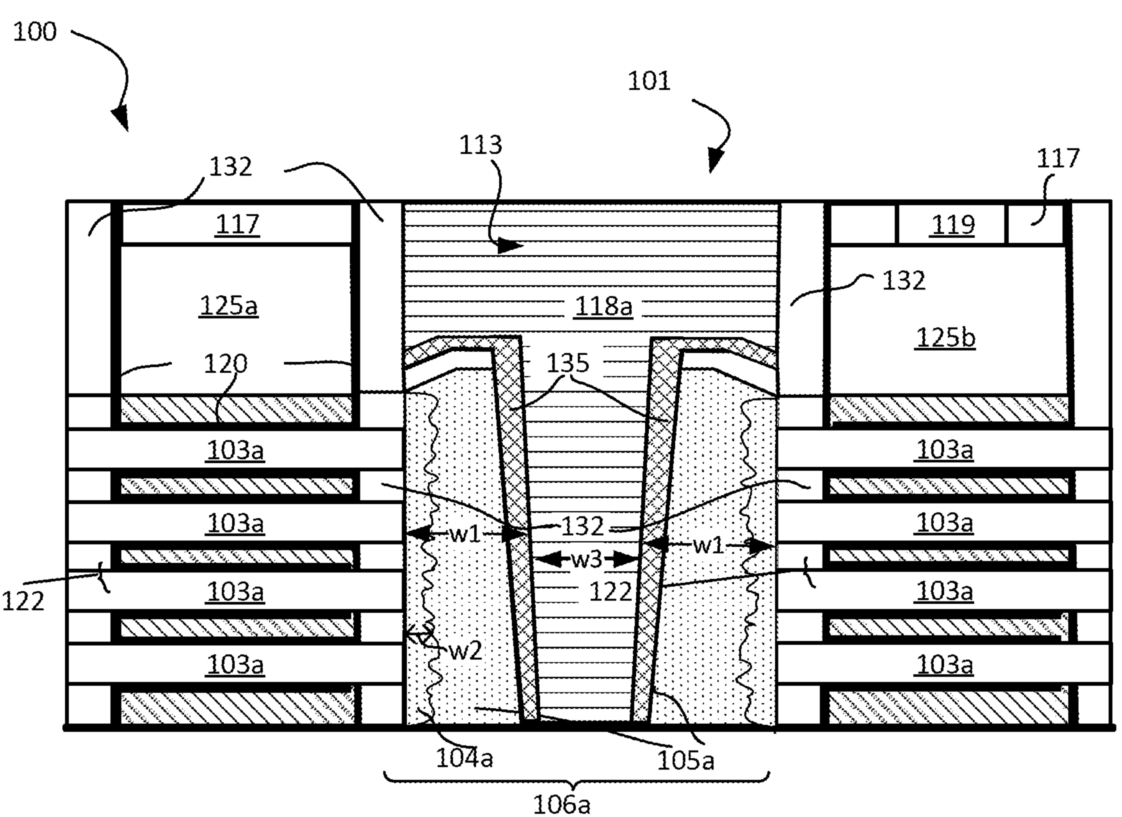
FIGS. 1B and 1C illustrate corresponding sections of the integrated circuit structure of FIG. 1A, with labelled distances between corresponding source contact and corresponding nanoribbons, in accordance with an embodiment of the present disclosure.
Figure 1C:
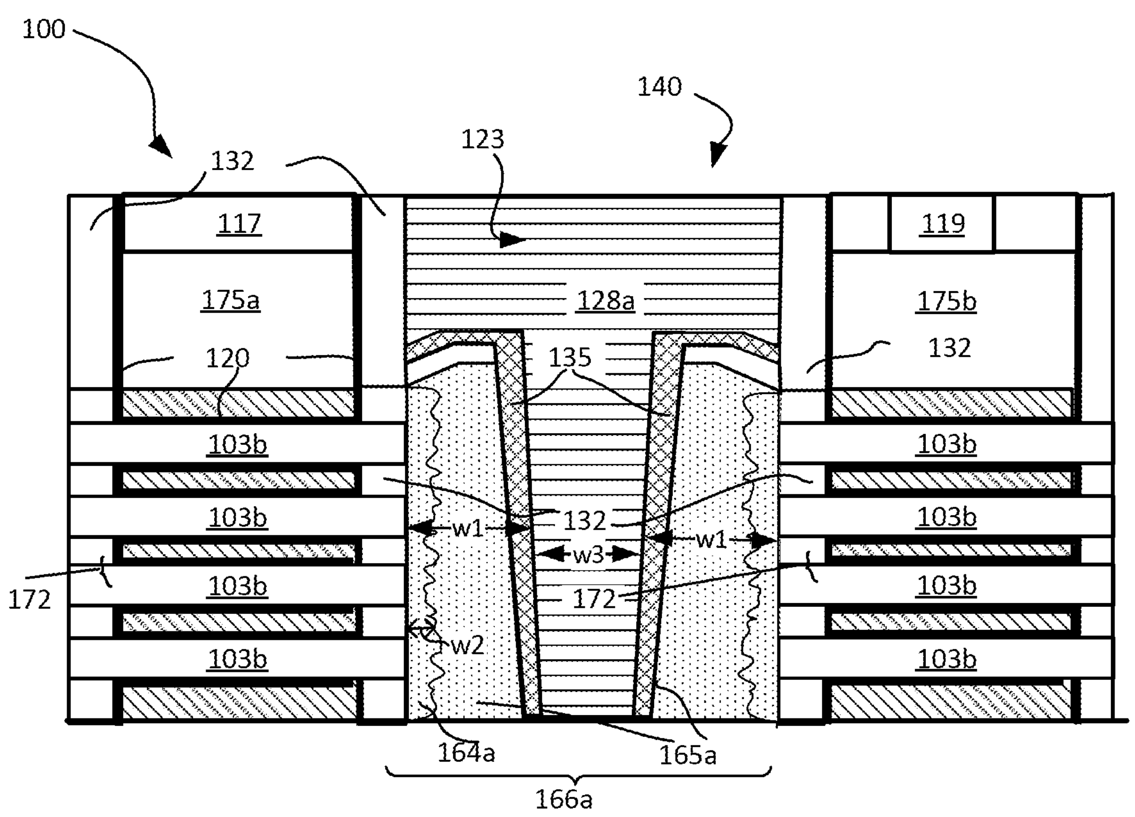

FIGS. 1B and 1C illustrate corresponding sections of the integrated circuit structure 100 of FIG. 1A, with labelled distances between corresponding source contact and corresponding nanoribbons, in accordance with an embodiment of the present disclosure. For example, FIG. 1B illustrates the source region 106*a* and adjacent components of the device 101 in further detail, and FIG. 1C illustrates the source region 166*a* and adjacent components of the device 140 in further detail.

Referring to FIG. 1B, a lower portion of the source contact 118*a*, which extends within the source region 106*a*, is at an average horizontal distance w1 from the corresponding nanoribbons 103*a*. Also illustrated in FIG. 1B is an average width w2 of the nucleation layer 104*a*, and an average width w3 of the lower portion of the source contact 118*a* (e.g., which extends within the source region 106*a*). The distances w1, w2, and w3 are measured in a horizontal direction parallel to a length of the nanoribbons. FIG. 1C similarly illustrates these distances for the source contact 128*a* of the device 140. Although FIGS. 1B and 1C illustrate distances w1, w2, and w3 associated with the source contacts 118*a* and 128*a*, substantially similar distances may also be associated with the drain contacts 118*b* and 128*b* of FIG. 1A.

Referring to FIG. 1B, in an example, the distance w1 between the lower portion of the source contact 118*a* (e.g., which extends within the source region 106*a*) and the nanoribbons 103*a* is in the range of 2-16 nm, or in the subrange of 2-12 nm, 2-8 nm, 2-5 nm, 3-16 nm, 3-12 nm, 3-8 nm, 3-5 nm, 5-16 nm, 5-12 nm, 5-8 nm, 8-16 nm, or another appropriate subrange within the range. In an example, the width w2 of the nucleation layer 104*a* is in the range of 1-8 nm, or in the subrange of 1-6 nm, 1-4 nm, 1-2 nm, 2-8 nm, 2-6 nm, 2-4 nm, 3-8 nm, 3-5 nm, 5-8 nm, or another appropriate subrange within the range. In an example, the width w3 of the source contact 118*a* is in the range of 2-20 nm, or in the subrange of 2-15 nm, 2-10 nm, 2-5 nm, 5-20 nm, 5-15 nm, 5-10 nm, 10-20 nm, or another appropriate subrange within the range. These distances are also applicable for the source contact 128*a* of FIG. 1C, and also applicable for the drain contacts 118*b* and 128*b* of FIG. 1A.

Referring again to FIG. 1A, the source contact 118*a* and the drain contact 118*b* of the device 101 comprise conductive material 113, and the source contact 128*a* and the drain contact 128*b* of the device 140 comprise conductive material 123. In an example, the conductive materials 113 and 123 are compositionally different from each other, as discussed herein below. In an example, the conductive materials 113 and 123 of the various source and drain contacts impart or induce (or otherwise facilitates) corresponding types of strains in respective ones of the devices 101, 140.

For example, assume that the upper device 101 is an NMOS device and the lower device 140 is a PMOS device (although in another example, the devices 140 and 101 can respectively be a PMOS and an NMOS device). In an example, increased compressive strain on nanoribbons 103*b* of the PMOS device 140 improves hole mobility within the nanoribbons 103*b*, resulting in better performance of the PMOS device 140. Put differently, if the nanoribbons 103*b* of the device 140 are compressively strained, the performance of the device 140 improves. On the other hand, increased tensile strain on nanoribbons 103*a* of the NMOS device 101 improves electron mobility within the nanoribbons 103*a*, resulting in better performance of the NMOS device 101. Put differently, if the nanoribbons 103*a* of the device 101 are under tensile strain, the performance of the device 101 improves.

In an example, the conductive material 113 of the source and drain contacts of the NMOS device 101 and the conductive material 123 of the source and drain contacts of the PMOS device 140 are selected to impart or induce (or facilitate in inducing) appropriate type of strain within nanoribbons of the corresponding devices. For example, the conductive material 123 is selected such that after deposition of the conductive material 123 within the source region 166*a* and the drain region 166*b* of the device 140, the conductive material 123 expands to an extent, thereby imparting comprehensive strain on the adjacent nanoribbons 103*b* of the PMOS device 140. For example, the distance w1 (see FIG. 1C) between the conductive material 123 of the source contact 128*a* and the nanoribbons 103*b* is sufficiently small (e.g., in the range of 2-16 nm), such that the conductive material 123 of the source contact 128*a* can induce meaningful compressive strain within the adjacent nanoribbons 103*b*. Similarly, the conductive material 123 of the drain contact 128*b* induces meaningful compressive strain within the adjacent nanoribbons 103*b*. In an example, an appropriate conductive material 123 that can induce such compressive strain within the adjacent nanoribbons 103*b* may be used. Examples of such conductive material 123 include tungsten (W), cobalt (Co), or an alloy thereof.

In an example, the conductive material 113 for the device 101 is selected such that after deposition of the conductive material 113 within the source region 106*a* and the drain region 106*b* of the device 101, the conductive material 113 compresses to an extent, thereby imparting tensile strain on the adjacent nanoribbons 103*a* of the NMOS device 101. For example, the distance w1 (see FIG. 1B) between the conductive material 113 of the source contact 118*a* and the nanoribbons 103*a* is sufficiently small (e.g., in the range of 2-16 nm), such that the conductive material 113 of the source contact 118*a* can induce meaningful tensile strain within the adjacent nanoribbons 103*a*. Similarly, the conductive material 113 of the drain contact 118*b* induces meaningful tensile strain within the adjacent nanoribbons 103*a*. In an example, an appropriate conductive material 113 that can induce such tensile strain within the adjacent nanoribbons 103*a* may be used. An example of such conductive material 113 include molybdenum or an alloy thereof.

Figure 1D:
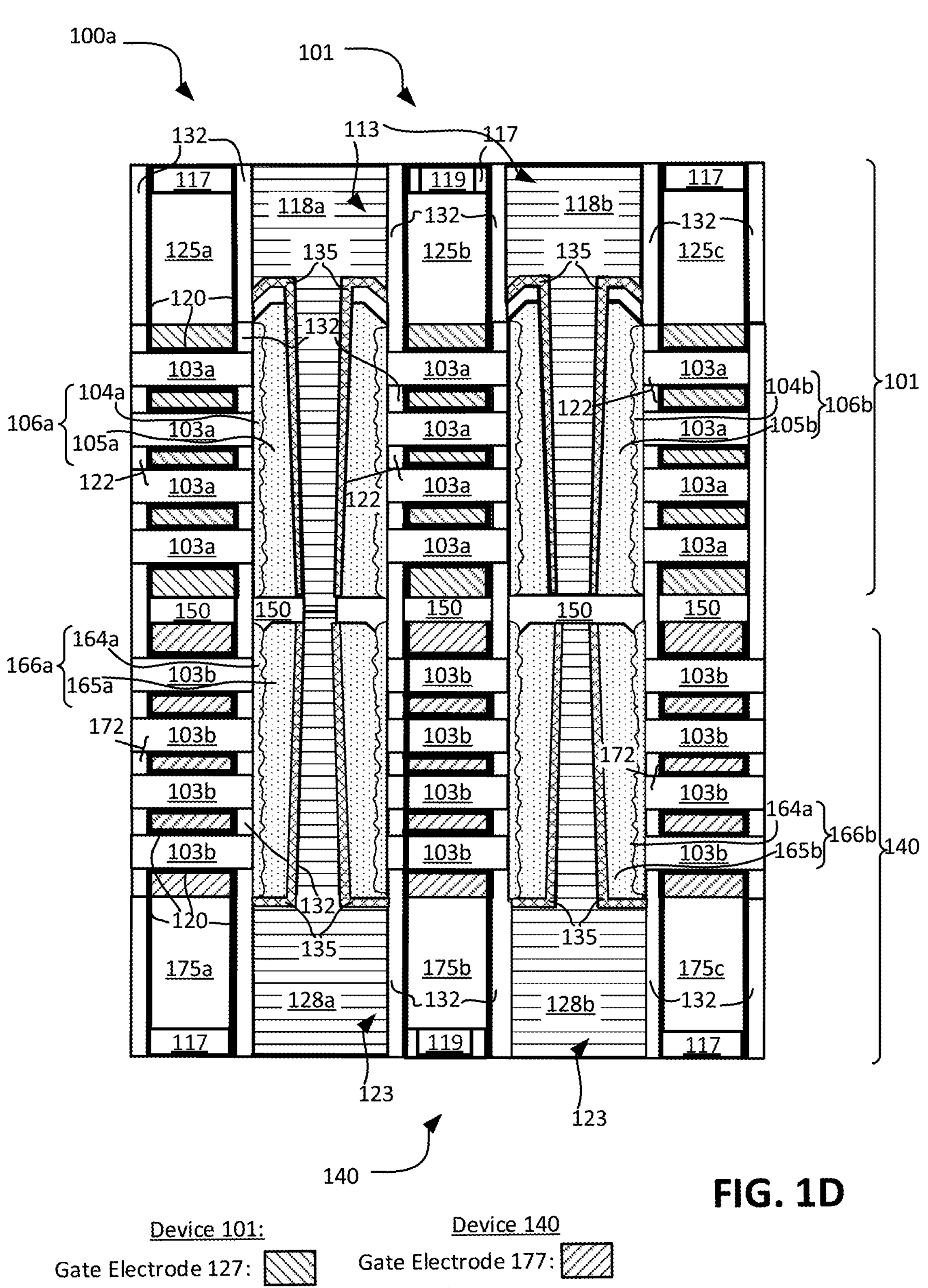
FIG. 1D illustrates a cross-section view of an integrated circuit structure including a vertically stacked architecture having a first device above a second device, wherein the integrated circuit structure comprises (i) a first conductive material for a first source contact and a first drain contact of the first device and (ii) a second conductive material for a second source contact and a second drain contact of the second device, wherein the first conductive material facilitates inducing a first type of strain in first channel region of the first device, wherein the second conductive material facilitates inducing a second type of strain in second channel region of the second device, and wherein the first source contact and the second source contact are in contact with each other, in accordance with an embodiment of the present disclosure.

FIG. 1D illustrates a cross-section view of an integrated circuit structure 100*a* including a vertically stacked architecture having a first device 101 above a second device 140, wherein the integrated circuit structure 100*a* comprises (i) a first conductive material 113 for a first source contact 118*a* and a first drain contact 118*b* of the first device 101 and (ii) a second conductive material 123 for a second source contact 128*a* and a second drain contact 128*b* of the second device 140, wherein the first conductive material 113 facilitates inducing a first type of strain in first channel region 103*a* of the first device 101, wherein the second conductive material 123 facilitates inducing a second type of strain in second channel region 103*b* of the second device 140, and wherein the first source contact 118*a* and the second source contact 128*a* are in contact with each other, in accordance with an embodiment of the present disclosure. The structure 100*a* of FIG. 1D is at least in part similar to the structure 100 of FIGS. 1A-1C, and similar components in the two structures 100 and 100*a* are labelled similarly. The discussion with respect to the structure 100 of FIGS. 1A-1C also applies to the structure 100*a* of FIG. 1D.

However, unlike the structure 100 of FIGS. 1A-1C, in the structure 100*a* of FIG. 1D, the source contact 118*a* and the source contact 128*a* are coupled, or otherwise in contact with each other. For example, the source contact 118*a* and/or the source contact 128*a* punch through the isolation region 150 between the source regions 106*a*, 166*a*, such that the lower surface of the source contact 118*a* is in contact with the upper surface of the source contact 128*a*. Note that although FIG. 1D illustrates the source contacts 118*a*, 128*a* being in contact with each other, in another example, instead of or in addition to the source contacts, the drain contacts 118*b* and 128*b* may also be in contact with each other in a similar manner, e.g., based on the design or application of the circuit for which the devices 101, 140 are being used.

Figure 1E:
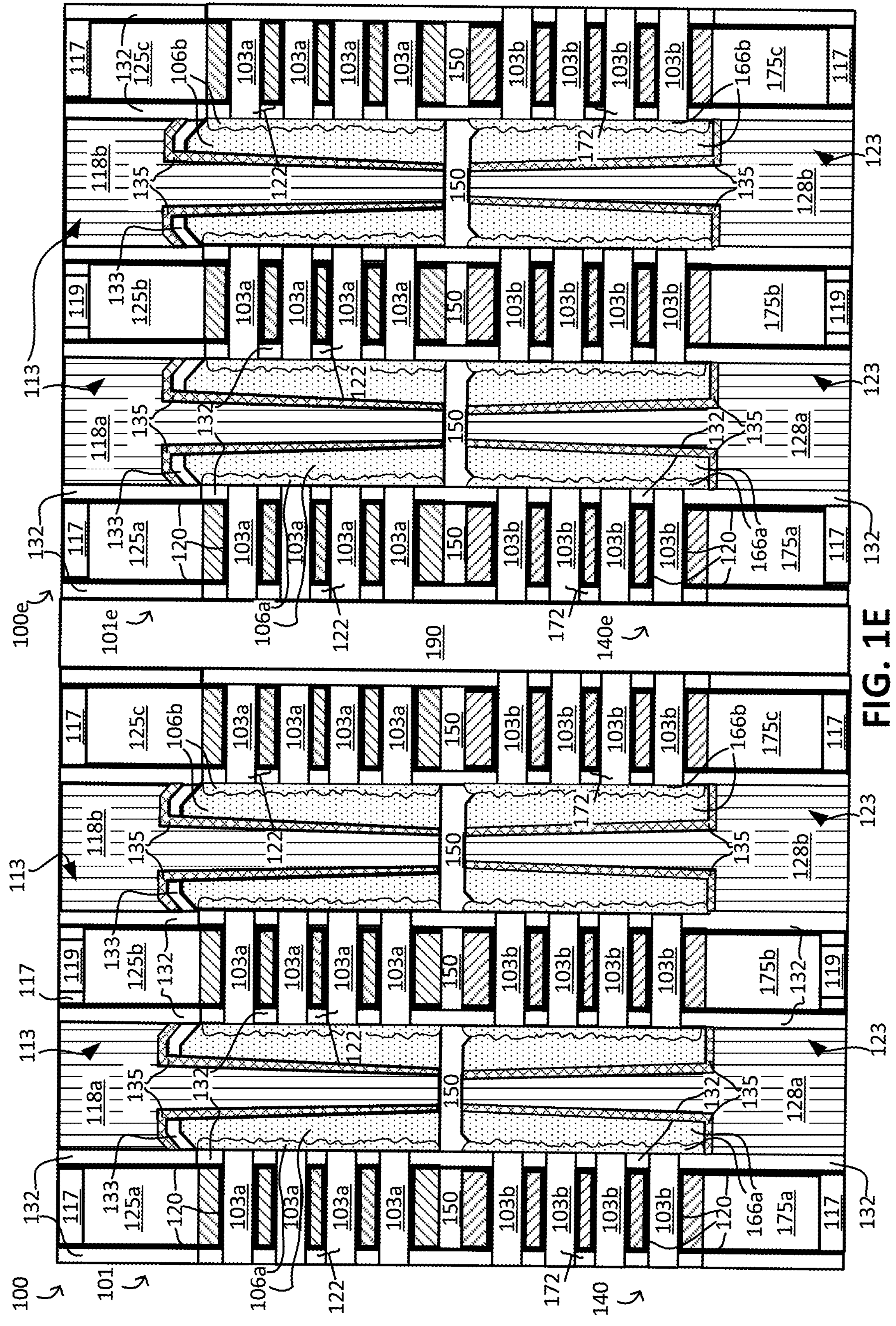
FIG. 1E illustrates the integrated circuit structure including the vertically stacked first device and the second device the of FIGS. 1A-1C laterally adjacent to a similar structure including vertically stacked third device and fourth device, in accordance with an embodiment of the present disclosure.

FIG. 1E illustrates the structure 100 including the vertically stacked first device 101 and the second device 140 the of FIGS. 1A-1C laterally adjacent to a similar structure 100*e* including vertically stacked third device 101*e* and the fourth device 140*e*, in accordance with an embodiment of the present disclosure. The upper device 101*e* of the structure 100*e* is similar to the upper device 101 of the structure 100 and components of the two devices 101 and 101*e* are labelled similarly. The lower device 140*e* of the structure 100*e* is similar to the lower device 140 of the structure 100 and components of the two devices 140 and 140*e* are labelled similarly. The structures 100 and 100*e* are separate by an isolation region 190, which may be a gate cut or a non-conductive barrier or wall between the two structures 100 and 100*e*. Thus, FIG. 1E illustrates two laterally adjacent structures 100 and 100*e* each having vertically stacked devices, each structure having an upper device with a first conductive material for source and drain contacts, and a lower device with a second conductive material for source and drain contacts, where the first and second conductive materials are elementally different or otherwise compositionally different in that they induce different types of strain of corresponding adjacent nanoribbons, as discussed with respect to FIGS. 1A-1C.

Figure 1F:
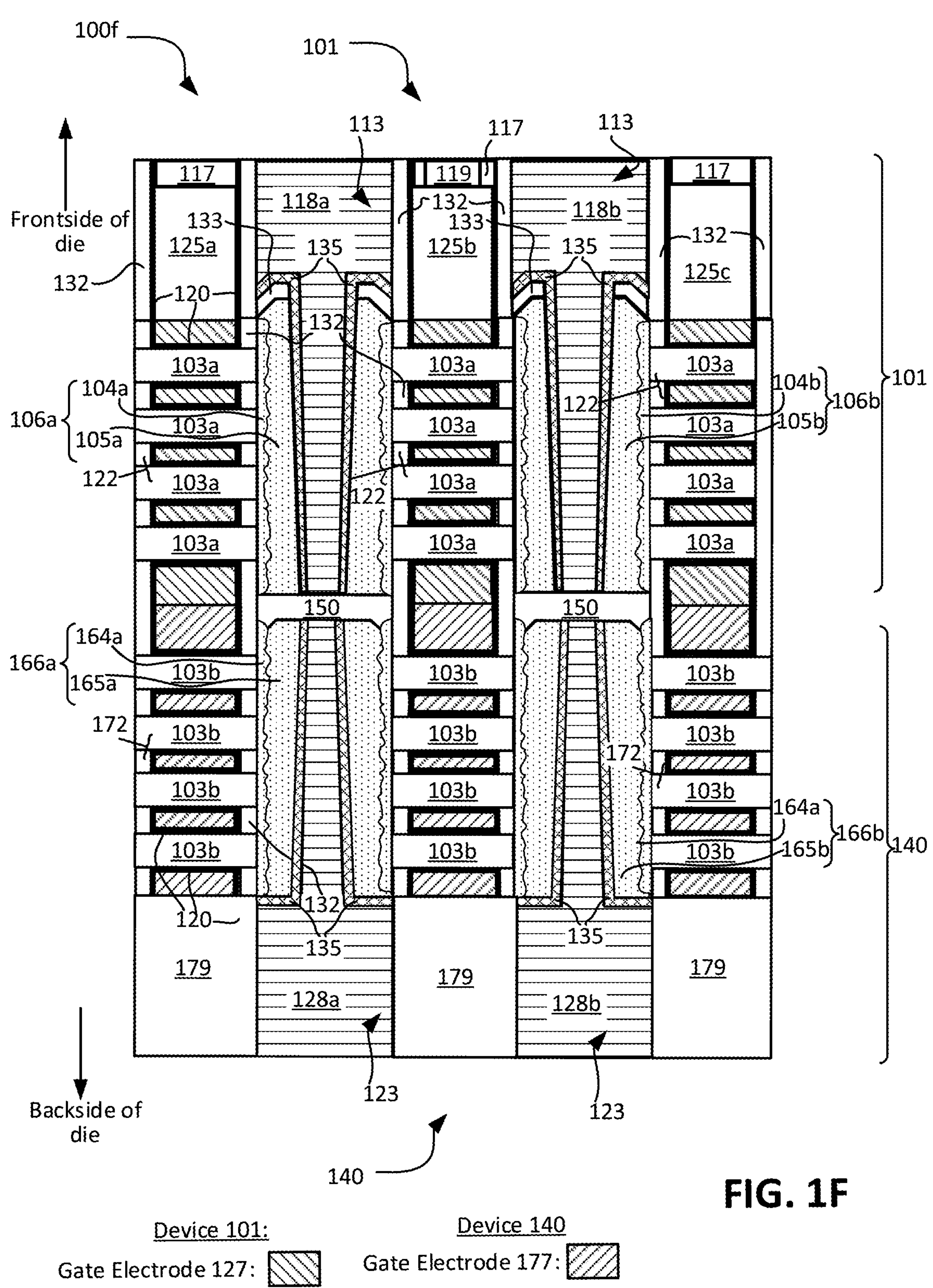
FIG. 1F illustrates an integrated circuit structure that is similar to the integrated circuit structure of FIG. 1A, but without gate contacts for the lower device, in accordance with an embodiment of the present disclosure.

FIG. 1F illustrates an integrated circuit structure 100*f* that is similar to the integrated circuit structure 100 of FIG. 1A, but without gate contacts for the lower device 140, in accordance with an embodiment of the present disclosure. For example, in FIG. 1F, for each column of gate stack, a gate electrode 127 of the upper device 101 is in contact with a corresponding gate electrode 177 of the lower device 140. That is, the isolation region 150 (see FIG. 1A) is absent between gate stacks of the upper and lower devices.

Thus, in FIG. 1F, the gate stack 172 of the lower device 140 are accessed from the corresponding gate contacts 125 of the upper device 101. In this example of FIG. 1F, the structure 100*f* is formed on a substrate 179, and the source and drain contacts 128*a*, 128*b* of the lower device 140 extends through the substrate 179.

Figure 2:
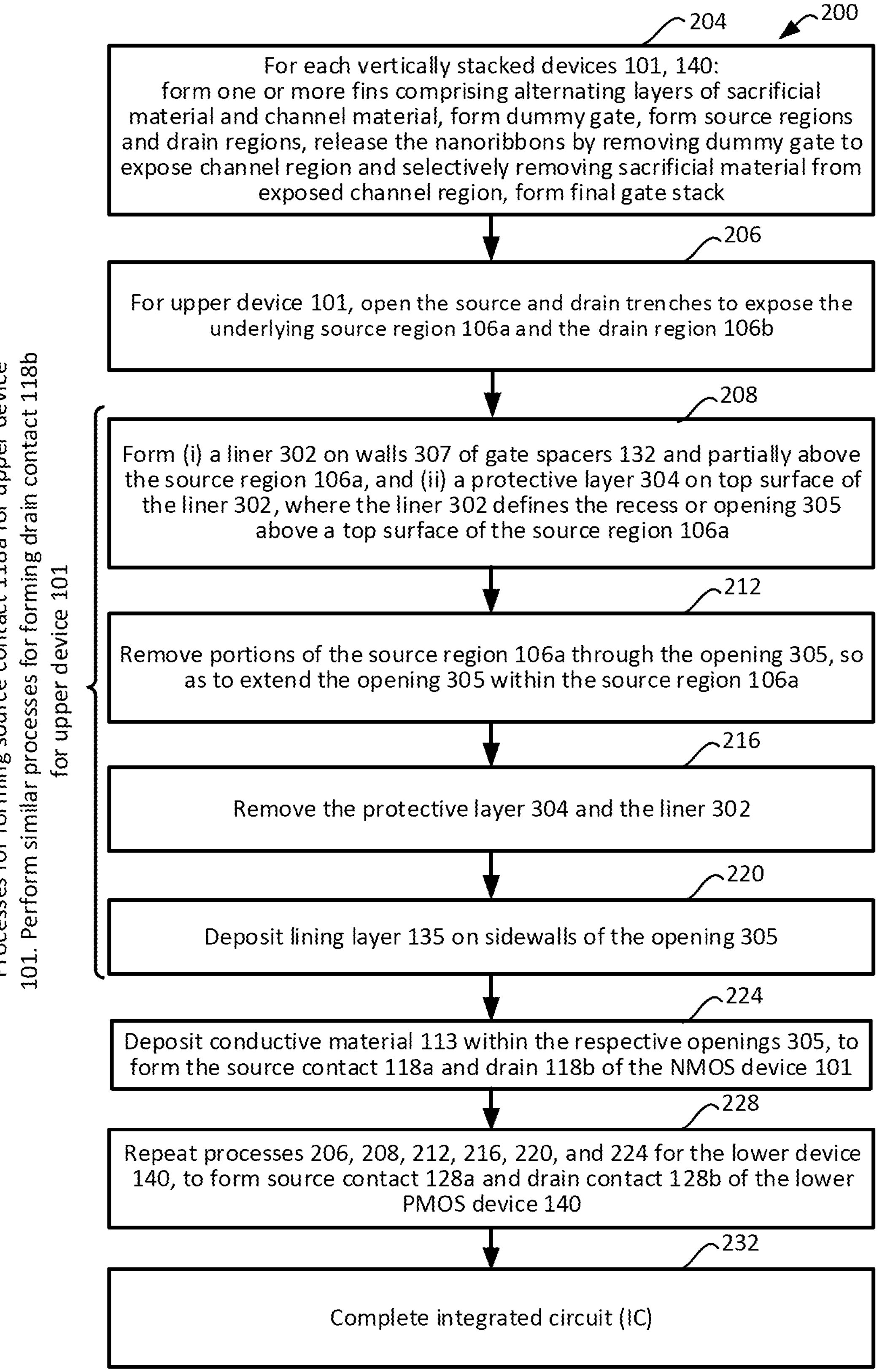
FIG. 2 illustrates a flowchart depicting a method of forming the example nanoribbon semiconductor structure of FIGS. 1A-1C, in accordance with an embodiment of the present disclosure.
Figure 3A:
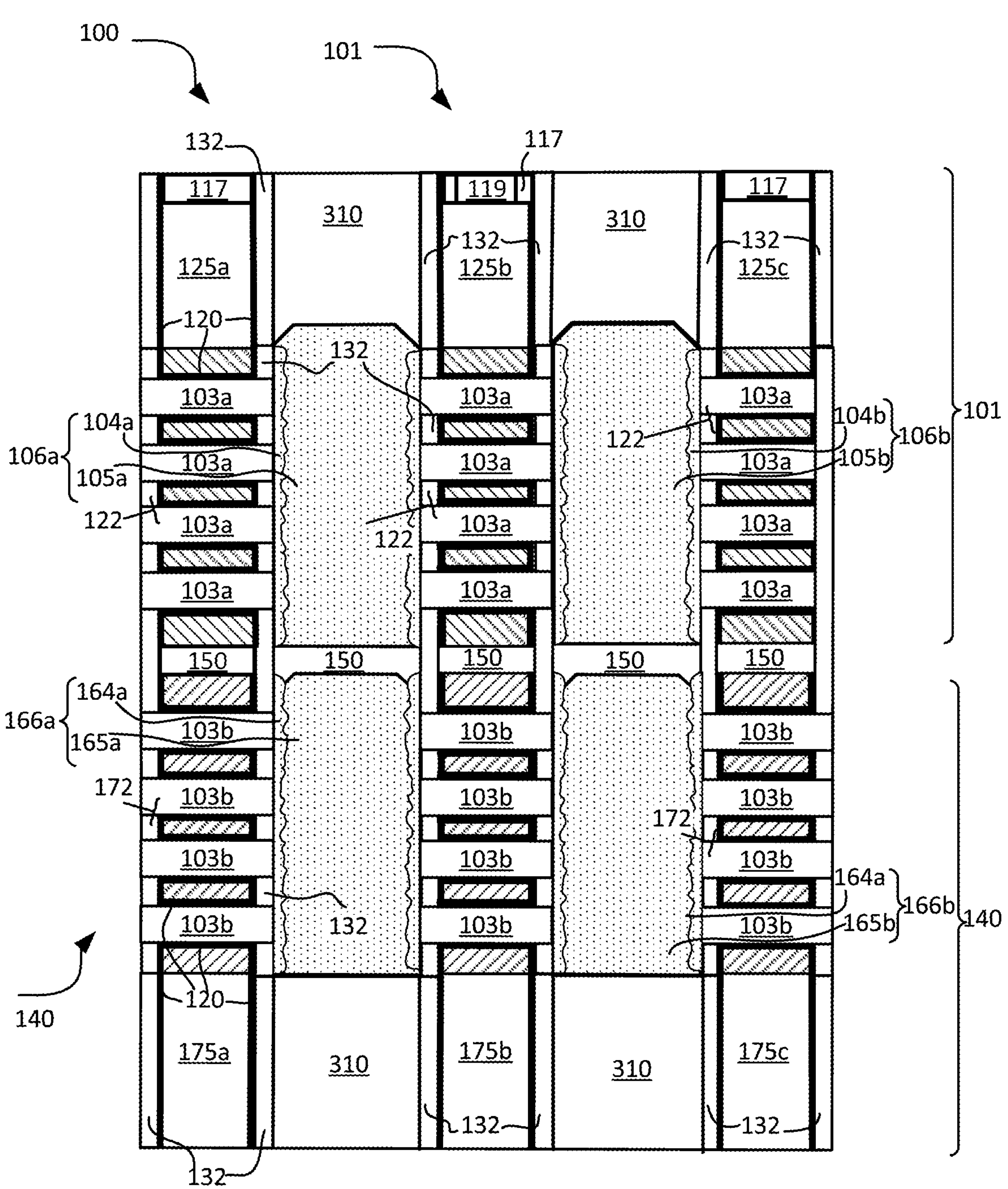
FIGS. 3A, 3Aa, 3A1, 3A2, 3B1, 3B2, 3C, 3D, 3D1, 3E, 3F, 3F1, 3F2, 3G, 3G1, 3H, 3H1, 3I, and 3I1 collectively illustrate cross-sectional views of an example semiconductor structure (e.g., the semiconductor structure of FIGS. 1A-1C) in various stages of processing, in accordance with an embodiment of the present disclosure.
Figure 3A:
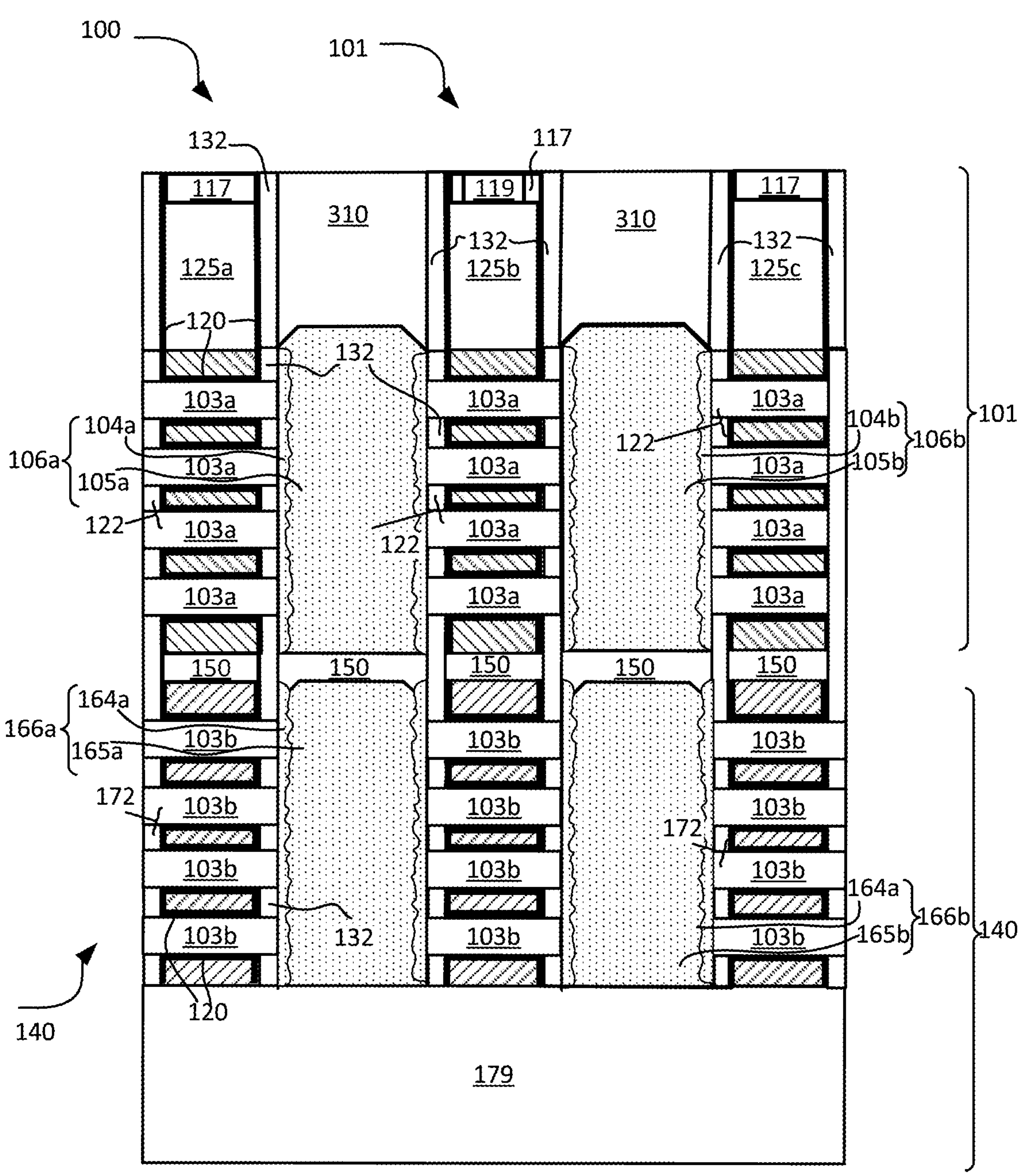
Figure 3C:
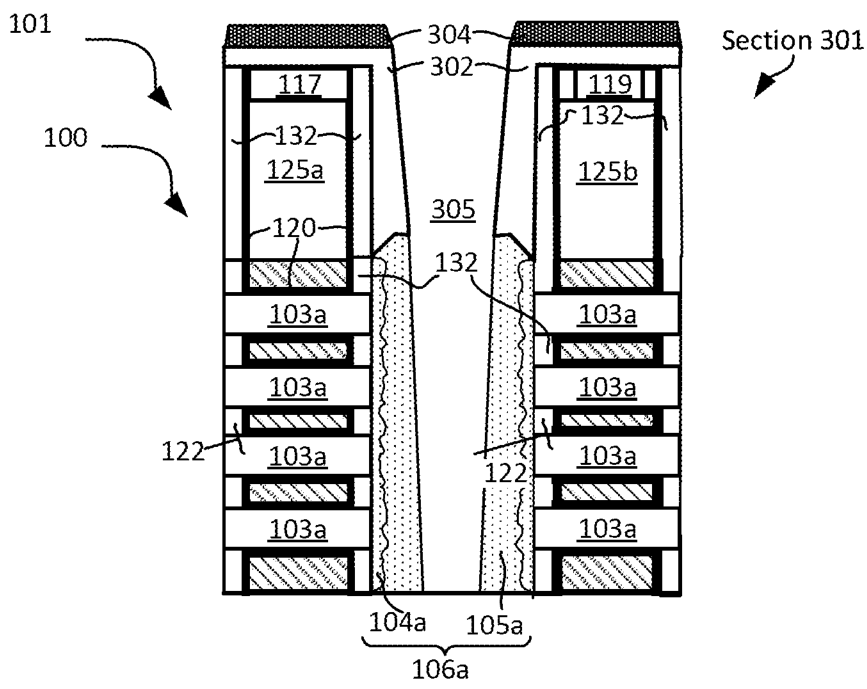

FIG. 2 illustrates a flowchart depicting a method 200 of forming the example nanoribbon semiconductor structure 100 of FIGS. 1A-1C, in accordance with an embodiment of the present disclosure. FIGS. 3A, 3Aa, 3A1, 3A2, 3B1, 3B2, 3C, 3D, 3D1, 3E, 3F, 3F1, 3F2, 3G, 3G1, 3H, 3H1, 3I, and 3I1 collectively illustrate cross-sectional views of an example semiconductor structure (e.g., the semiconductor structure 100 of FIGS. 1A-1C) in various stages of processing, in accordance with an embodiment of the present disclosure. FIGS. 2 and 3A-3I will be discussed in unison. The cross-sectional views of FIGS. 3A-3I correspond to the cross-sectional view of FIG. 1A.

Referring to FIG. 2, the method 200 includes, at 204, for each of the vertically stacked devices 101 and 140, forming one or more fins comprising alternating layers of sacrificial material and channel material, forming dummy gate, forming source regions and drain regions, releasing the nanoribbons by removing the dummy gate to expose the channel region and then selectively removing sacrificial material from exposed channel region, and then forming the final gate stack. Thus, in the process 204, a major portion of the vertically stacked devices 101 and 140, except, for example, the respective source and drain contacts, are formed. The process 204 may include any appropriate techniques for forming nanoribbons, source and drain regions, and gate stack of a GAA device architecture having two vertically stacked GAA device, such as devices 101 and 140. As illustrated in FIG. 3A, after process 204, the source and drain contacts of the devices have not yet formed, the source and drain regions of individual devices are covered by respective dielectric material 310. For example, dielectric material 310 is above the source region **106*a*, and covers the source region 106*a*; dielectric material 310 is below the source region 166*a*, and covers the source region 166*a***; and so on.

Note in this example of FIG. 3A, the source region **106*a* (and also the other source and drain regions) includes a fully merged epitaxial structure, in that the epitaxial deposition grew from both the left and right nanoribbons to meet and merge to provide an overall diffusion region 106*a*. In other embodiments, the epitaxial growth may be timed to not merge, such that there is a space between the two epitaxial growths, so the resulting structure would look similar to that shown in FIG. 3D1. That is, in such case, the two epitaxial regions would be unmerged, with the opening 305 of FIG. 3D1 between the two epitaxial regions. In such example cases, no recessing of the diffusion region (discussed with respect to FIGS. 3A1-3C) would be needed, and processes 208, 212, and 216 of method 200** may be skipped.

As discussed herein previously, one of the devices 101 or 140 is a PMOS device, and the other of the devices 101 or 140 is an NMOS device. The doping profile and/or the material of the source and drain regions and/or the nanoribbons of a specific device may be in accordance with the type of the device. In an example, the device 101 is an NMOS device and the device 140 is a PMOS device, and the doping profile and/or the material of the source and drain regions and/or the nanoribbons of the devices 101 and 140 are selected accordingly, as also discussed herein previously. For example, source and drain regions of the device 140 can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions of the device 101 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, PMOS source and drain regions are boron-doped SiGe, and NMOS source and drain regions are phosphorus-doped silicon. In a more general sense, the source and drain regions can be any semiconductor material suitable for a given application.

Note that in FIG. 3A and some of subsequent FIGS. 3A1-3H, the gate electrodes 175 of the lower device 140 are illustrated. However, in some examples (see FIG. 1F), the gate electrodes 175 of the lower device 140 are absent. Accordingly, FIG. 3Aa, the gate electrodes 175 of the lower device 140 are absent. In the example of FIG. 3Aa, the structure 100 is formed on a substrate 179. Note that in another example, the gate electrodes 175 of the lower device 140, as illustrated in FIG. 3A, may be formed later during the process, such as after forming the upper and lower source and drain contacts.

Referring again to FIG. 2, the method 200 then proceeds from 204 to 206, where for the upper device 101, the source and drain trenches are opened (e.g., by removing dielectric material 310 above the source region **106*a* and the drain region 106*b*), to expose the underlying source region 106*a* and the drain region 106*b*, as illustrated in FIG. 3A1. As a result, openings 305 are formed above the source region 106*a* and the drain region 106*b*. In an example, at process 206, the source and drain trenches are opened for the upper device 101, and not for the lower device 140, as illustrated in FIG. 3A1**.

Subsequent to the process 206, a portion of the upper device 101, which includes the source region **106*a* and adjacent nanoribbons 103*a*, is illustrated as section 301 in FIG. 3A1. Thus, the section 301 includes the source region 106*a* of the upper device 101. Note that FIG. 3A2 illustrates the section 301 of the structure 100 of FIG. 3A1. In FIGS. 3B1-3F2, various processes (e.g., processes 208, 212, 216, and 220, and 224) performed on the section 301 (i.e., on the source region 106*a* of the upper device 101) to form the source contact 118*a* are illustrated. Similar processes may also be performed (e.g., performed at least in part in parallel or simultaneously) for forming the drain contact 118*b* for the device 101. Note that when the source and drain regions of the upper device 101 are being processed, no such processing is performed for the source and drain regions of the lower device 140**.

Referring again to FIG. 2, the method 200 then proceeds from 206 to 208, where a layer of liner 302 is deposited on walls 307 of gate spacers 132 and above the source region **106*a*, and a protective layer 304 is deposited on top surfaces of the liner 302, as illustrated in FIG. 3B1. The protective layer 304 allows the lower lateral portion of liner 302 to be selectively removed from above the source region 106*a*. For example, the liner 302 may initially be deposited on walls 307 of the gate spacers 132 and also above the source region 106*a*, as illustrated in FIG. 3B1. Subsequently, protective layer 304 is selectively deposited on the upper layer of liner 302 and less so on the lower surface of 302 given, for example, a directional nature of the deposition and/or aspect ratio of trench 305 (e.g., trench 305 is five or more time taller than it is wide, and is even narrower once liner 302 is deposited), according to an embodiment. With the protective layer 304 in place, the horizontal section of the liner 302 may be etched and removed from above the source region 106*a*, such that the liner remains on walls 307 of gate spacers 132 and only partially above the source region 106*a*, thereby once again extending opening 305 down to a surface of the source region 106*a*, as illustrated in FIG. 3B2. A directional etch that is selective to the material of protective layer 304 can be used to remove that portion of liner 302. Note that, in some cases, protective layer 304 may also deposit on top of that portion of liner 302, but that lower layer 304 is thinner than the upper layer 304 (e.g., because is it more difficult to deposit layer 304 into the trench 305 that is now even narrower due to presence of liner 302, particularly when a directional deposition is used to provide protective layer 304), and that thinner portion of the layer 304 can thus be completely removed along with liner 302 by the directional etch, while at least some of the thicker upper portion of layer 304** survives the selective etch.

As illustrated in FIG. 3B2, the liner 302 defines the recess or opening 305 above a top surface of the source region 106*a*. In an example, the liner 302 may also be deposited above the gate stack, including the gate electrode 125. The liner 302 and protective layer 304 may each be deposited using an appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. As explained above, a directional deposition may be used for the protective layer 304, to facilitate its selective or otherwise more substantial deposition on the upper surface of the structure, relative to the lower surface within trench 305.

In an example, a thickness or width of the liner 302 (as may be trimmed by the directional etch described above) dictates a width of the opening 305, which in turn dictates the width (e.g., w3, see FIG. 1B) of the source contact 118*a* to be eventually formed within the source region 106*a*. Accordingly, the width w3 of the source contact 118*a* may be controlled by controlling a width of the deposited liner 302.

In an example, the liner 302 and protective layer 304 are both etch selective with respect to the material of the source region 106*a*. For example, an etch process that etches the source region 106*a* may not substantially etch (or etch at a substantially slower rate) the liner 302 or layer 304. As will be seen herein later in turn, the liner 302 protects the gate spacers 132 and the gate electrode 125, when a recess for a source contact is formed within the source region 106*a*. An example of the liner 302 may comprises silicon nitride, or another appropriate nitride, oxide, carbide, oxycarbide, oxynitride, or oxycarbonitride.

Also, note that in this example the protective layer 304 acts as a "helmet" in the sense that it protects the liner 302, e.g., when the recess within the source region 106*a* is formed (discussed herein later). Similar to the liner 302, the protective layer 304 also is etch selective to the material of the source region 106*a*. In an example, the protective layer 304 comprises an appropriate nitride, oxide, carbide, oxycarbide, oxynitride, or oxycarbonitride, for example, titanium nitride (TiN). In another example, layer 304 may be removed before performing the selective etch of source region 106*a*, such that only liner 302 remains during that selective etch.

As discussed, process 208 (and subsequent processes 212, 216, and 220) and corresponding FIGS. 3B1, 3B2 (and subsequent FIGS. 3C-3F) are specifically for forming the source contact 118*a*, and similar processes may be at least partly simultaneously performed for forming the drain contact 118*b* for the device 101. Further recall that the source contact 128*a* and the drain contact 128*b* for the device 140 can be formed in a separate process, according to an example.

Referring again to FIG. 2, the method 200 then proceeds from 208 to 212, where portions of the source region 106*a* is removed through the opening 305, so as to further extend the opening 305 within the source region 106*a*, as illustrated in FIG. 3C. An anisotropic and/or directional etch can be performed, to extend the opening 305 within the source region 106*a*. The etch process is selective to the liner 302 and the protective layer 304, such that a rate of etching the source region 106*a* is substantially faster than a rate of etching the liner 302 and/or the protective layer 304. Accordingly, after the etch process 212, the liner 302 and the protective layer 304 continue to cover the walls of the gate spacer 132 and the gate electrode 125. In an example, the isolation structure 150 (see FIG. 3A1) acts as an etch stop layer, such that a portion of the top surface of the isolation structure 150 is exposed through the opening 305. In another example, a timed etch process is employed, such that in some cases, the bottom surface of the opening 305 may not reach the isolation structure 150.

In an example, the opening 305 extending through the source region 106*a* is illustrated to be slightly tapered (e.g., a lower section of the opening 305 has a lower diameter than an upper section of the opening 305). This may be a consequence of etching a deep opening 305 within the source region 106*a*. However, in another example, the opening 305 may be less (or more) tapered, or substantially non-tapered, relative to the tapering illustrated in FIG. 3C.

Figure 3D:
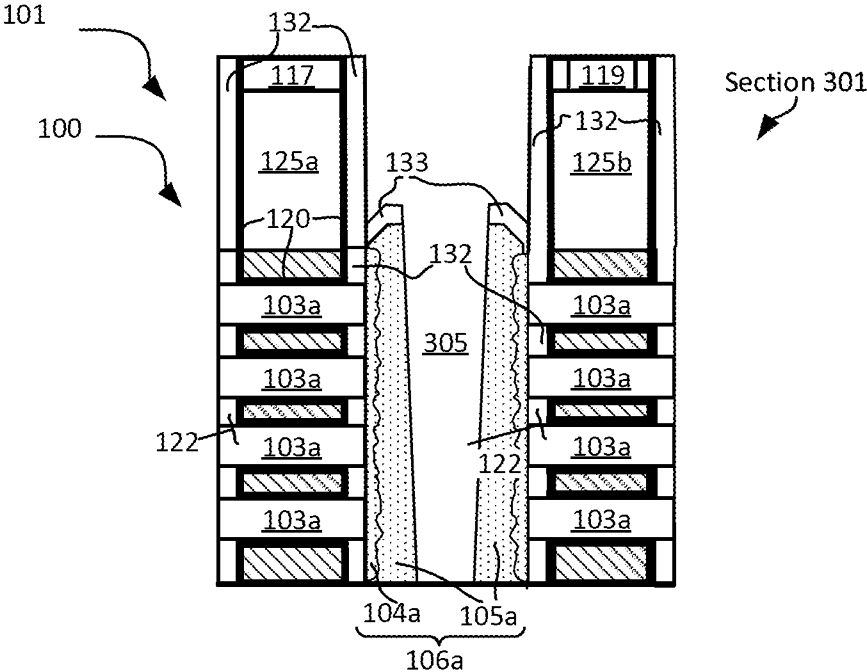
Figure 3E:
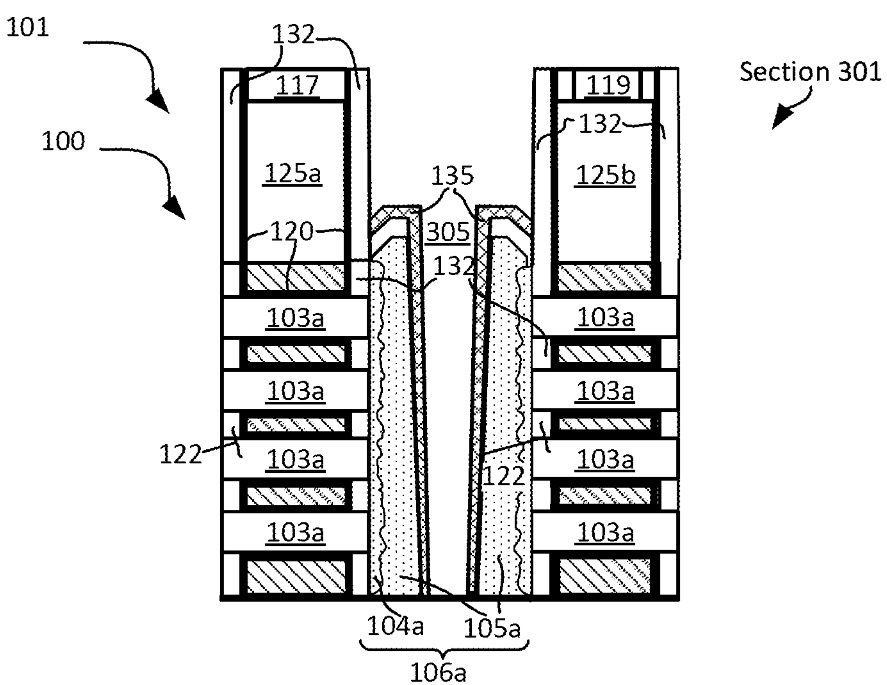

Referring again to FIG. 2, the method 200 then proceeds from 212 to 216, where the protective layer 304 and the liner 302 are removed, as illustrated in FIG. 3D. For example, an isotropic etch process may be employed that is selective to the material of the source region 106*a* (e.g., does not substantially etch the source region 106*a*). In an example, an entirety of the liner 302 may be removed (thus, dielectric material 133 will be absent in such an example). In another example, some sections of the liner 302 may remain, labelled as dielectric material 133, e.g., as illustrated in FIG. 3D. Although FIG. 3D illustrates only a horizontal portion of the liner 302 above the source region to be remaining after the process 216, in another example, some vertical remnants of the liner 302 may also be present on sidewalls of the gate spacers 132.

Note that as discussed herein above, in some embodiments, the epitaxial growth of the source region 106*a* may be timed to not merge, such that there is a space between the two epitaxial growths, so the resulting structure would look similar to that shown in FIG. 3D1. That is, in such case, the two epitaxial regions would be unmerged, with the opening 305 of FIG. 3D1 between the two epitaxial regions. In such example cases, no recessing of the diffusion region (discussed with respect to FIGS. 3A1-3C) would be needed, and processes 208, 212, and 216 of method 200 may be skipped.

Referring again to FIG. 2, the method 200 then proceeds from 216 to 220, where the lining layer 135 is deposited on sidewalls of the opening 305, and subsequently annealed. In an example, the conductive lining layer 135 is representative of one or more silicide layer(s), germanide layer(s), and/or adhesive layer(s) between the conductive source or drain metal contact and the adjacent source or drain region. In an example, the lining layer 135 reduces contact resistance of the source and drain contacts. The lining layer 135 may be deposited using an appropriate deposition technique, such as CVD, PVD, ALD, VPE, MBE, or LPE, for example.

Figure 3F:
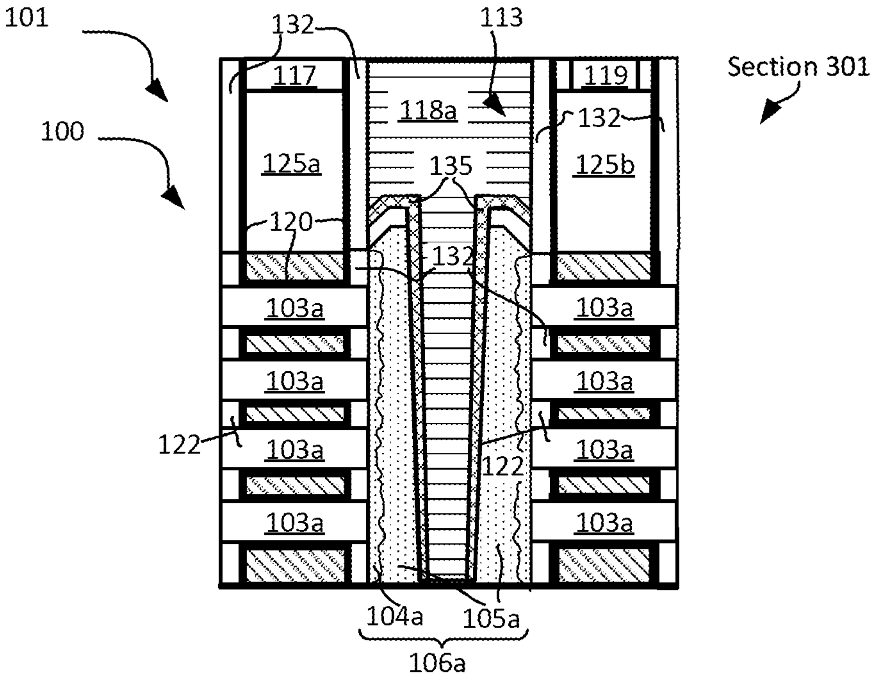

Referring again to FIG. 2, the method 200 then proceeds from 220 to 224. In process 224, conductive material 113 may be deposited within the respective openings extending within the source region 106*a* and the drain region 106*b* of the NMOS device 101, to respectively form the source contact 118*a* and drain contact 118*b* of the NMOS device 101. For example, FIG. 3F illustrates the source contact 118*a* comprising the conductive material 113 is formed and extends within the source region 106*a*. An example of such conductive material 113, which induces tensile strain on the nanoribbons 103*a* of the device 101, may include molybdenum or an alloy thereof, for example. In an example, the deposited conductive materials may be planarized using an appropriate planarization technique, such as mechanical polishing or chemical-mechanical polishing (CMP). This completes formation of the source and drain contacts 118*a*, 118*b* of the device 101.

Note that in FIG. 3F (and also in FIGS. 3D and 3E), remnants of the liner 302 is above a section of the source region 106*a*. For example, in FIG. 3F, a finger-like about horizontal protrusion extends between the top surface of the source region 106*a* and the source contact 118*a*, which is remnants of the liner 302 (see FIG. 3D). However, as illustrated in FIG. 3F1, in an example, the remnants of the liner 302 may be absent, e.g., based on the etch process used to remove the liner 302. In another example and as illustrated in FIG. 3F2, the remnants of the liner 302 may be on sidewalls of the gate spacer 132 and above the gate electrodes 125, e.g., based on the etch process used to remove the liner 302. Note that in the example of FIG. 3F2, a section of the liner 302 is above the dielectric material 117. In an example, the conductive via 119 (see FIG. 1A) can extend through the dielectric material 117 and also through the section of the liner 302 above the gate contact 175*b*. Although not illustrated, in yet another example, horizontal remnants of the liner 302 may be present above the source region 106*a* (e.g., as illustrated in FIG. 3F) and vertical remnants of the liner 302 may be present on sidewalls of the gate spacer 132 (e.g., as illustrated in FIG. 3F2).

Figure 3G:
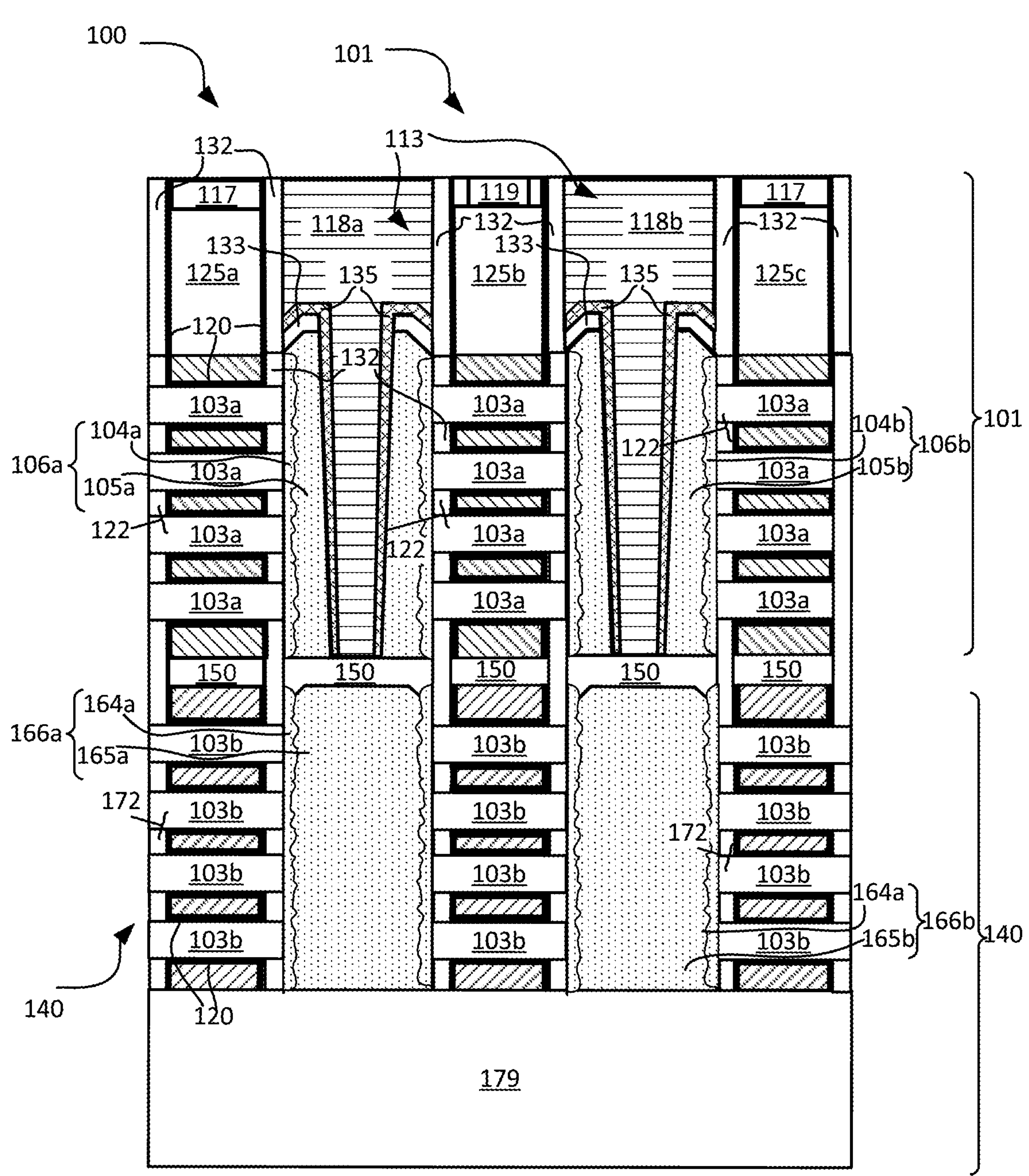

FIG. 3G illustrates the structure 100, after formation of the source and drain contacts 118*a*, 118*b* of the upper device 101. Note that the source and drain contacts of the lower device have not yet been formed, and the source region 166*a* and the drain region 166*b* are still covered by the dielectric material 310, as illustrated in FIG. 3G.

In FIG. 3G, the source contact 118*a* extends up to the isolation region 150, but doesn't extend within the isolation region 150. In contrast, in another example of FIG. 3G1, the source contact 118*a* extends in part within the isolation region 150, e.g., as discussed with respect to FIG. 1D herein previously.

Referring again to FIG. 2, the method 200 then proceeds from 220 to 228. At 228, the previously discussed processes 206, 208, 212, 216, 220, and 224 (which were previously discussed with respect to the upper device 101) are repeated for the lower device 140, to form source contact 128*a* and drain contact 128*b* of the lower PMOS device 140. Note that during repetition of the processes 206, 208, 212, 216, 220, and 224 for the lower device 140, the structure 100 may be flipped upside-down, such that the device 140 is above the device 101 (although FIGS. 3H and 3I illustrate the structure 100 within showing the flipping).

Figure 3H:
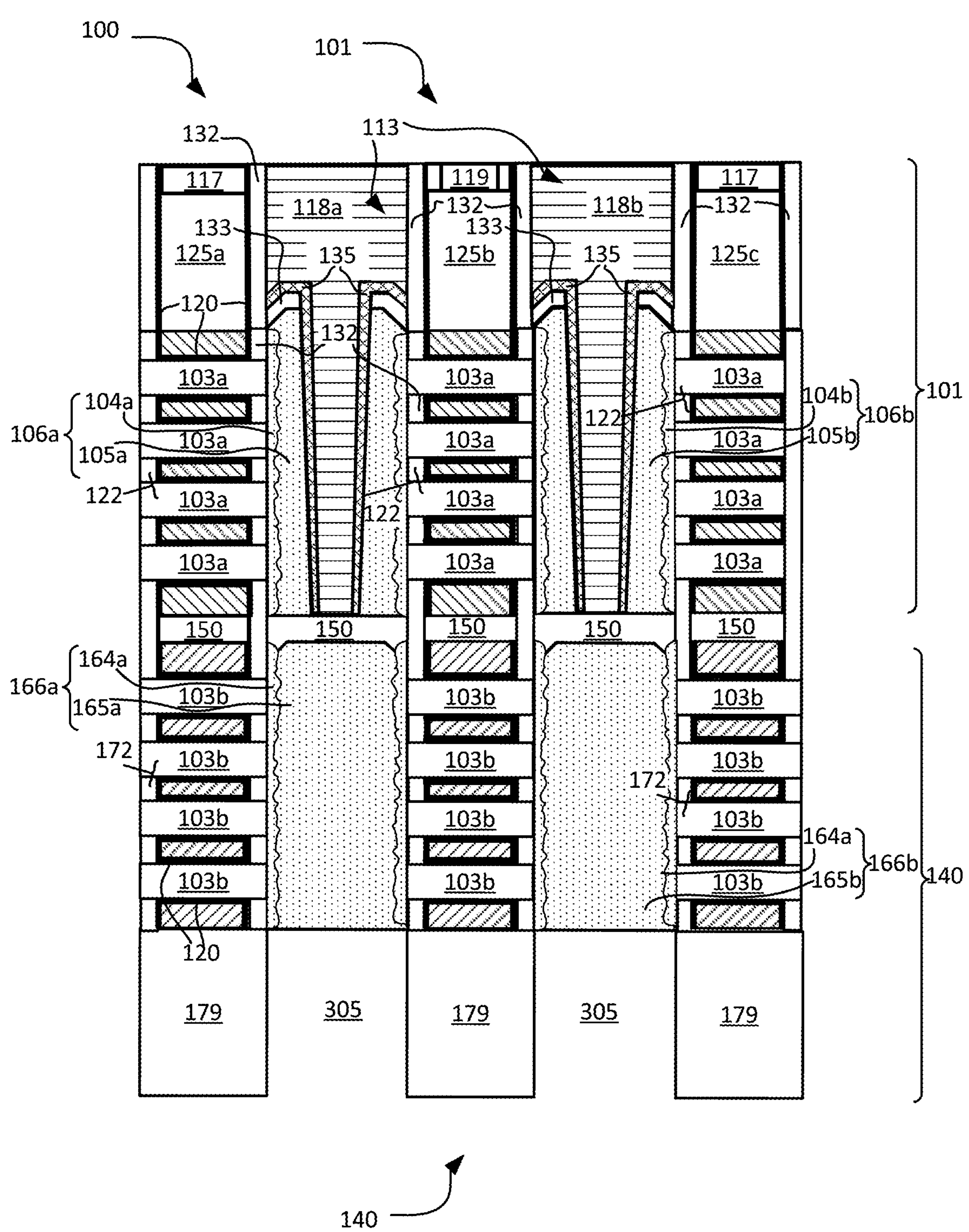

For example, FIGS. 3H and 3H1 illustrate for the lower device 140, opening the source and drain trenches (e.g., by removing dielectric material adjacent to the source region 166*a* and the drain region 166*b*), to expose the source region 166*a* and the drain region 166*b*, e.g., which is a repetition of the process 206 for the device 140. Note that in FIG. 3H, the source contact 118*a* does not extend within the isolation region 150, whereas in FIG. 3H1 the source contact 118*a* extends in part within the isolation region 150 (e.g., as discussed with respect to FIGS. 1D and 3G1 herein previously). Similarly, other processes 208, 212, 216, 220, and 224 are also repeated for the device 140, to form the source contact 128*a* and the drain contact 128*b* for the PMOS device 140, as illustrated in FIGS. 3I and 3I1. Thus, FIGS. 3I and 3I1 illustrate, after completion of the process 228, source and drain contacts 118*a*, 118*b* of the device 101, as well as source and drain contacts 128*a*, 128*b* of the device 140. Note that in FIG. 3I, the source contact 118*a* and the source contact 128*a* do not extend within the isolation region 150, whereas in FIG. 3I1 the source contacts 118*a* and 128*a* extend in part within the isolation region 150 and are in contact with each other (e.g., as discussed with respect to FIG. 1D herein previously).

Figure 3I:
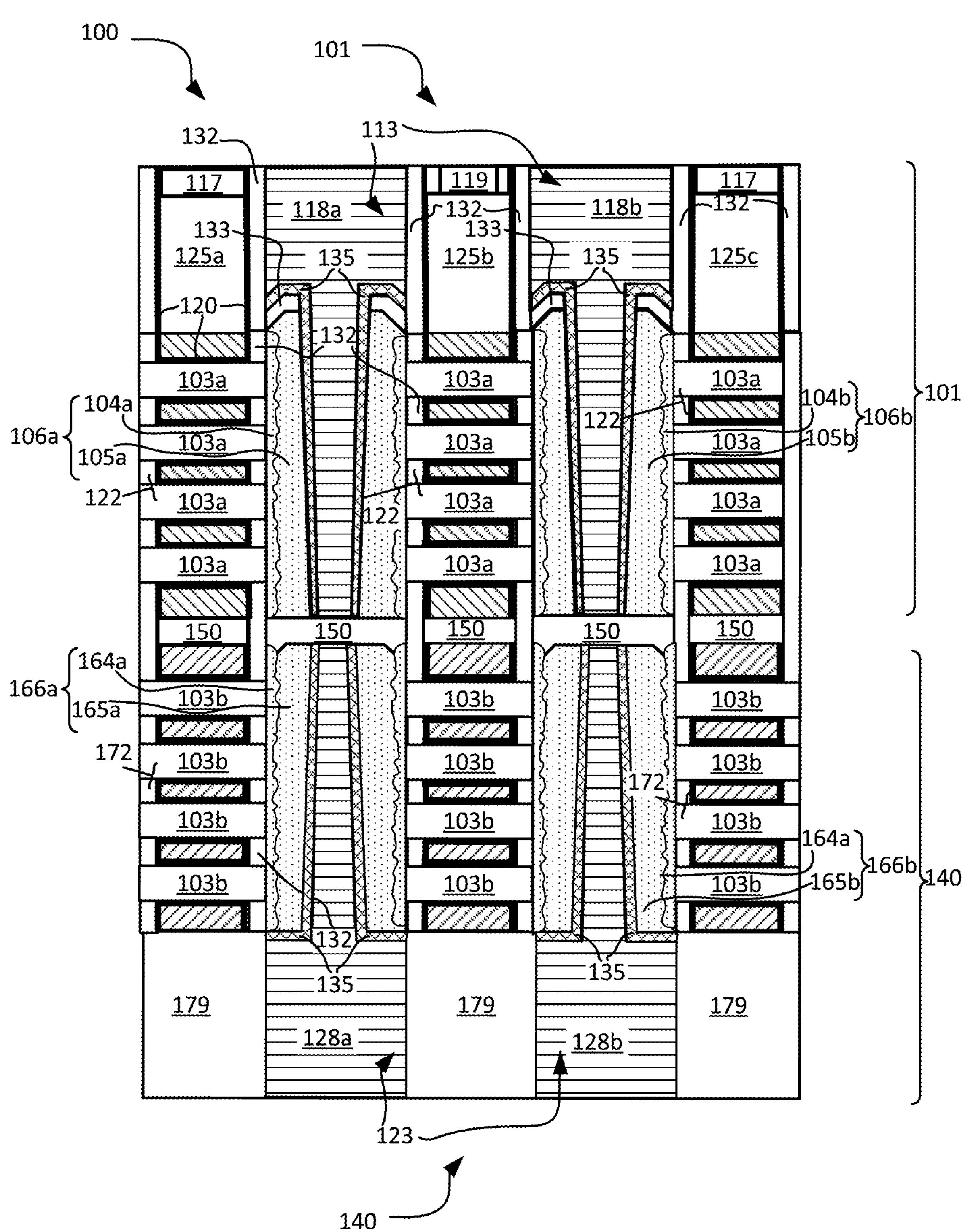

Note that a liner layer (e.g., similar to the liner layer 302 discussed herein previously) is used for forming the lower source and drain contacts 128*a*, 128*b*, although the liner layer is not illustrated in FIGS. 3H, 3H1, 3I, and 3I1. For example, in FIGS. 3I and 3I1, the liner layer used for forming the lower source and drain contacts 128*a*, 128*b* is fully removed, without any remnants of the liner layer remaining on sidewalls of the layer 179. However, similar to the illustration of FIG. 3F2 (which shows remnants of the liner layer 302 present on sidewalls of the gate spacers 132), remnants of the liner layer used for forming the lower source and drain contacts 128*a*, 128*b* may also be present on sidewalls of the layer 179 in FIGS. 3I and/or 3I1.

The method 200 of FIG. 2 then proceeds from 228 to 232, where a general integrated circuit (IC) is completed, as desired, in accordance with some embodiments. Such additional processing to complete an IC may include optionally forming gate electrodes 175 for the lower device 140 (e.g., see FIG. 1A), forming one or more conductive vias 119 that contact one or more of the gate contacts (see FIG. 1A, which shows the conductive via 119 contacting the gate contact 125*b*, for example), back-end or back-end-of-line (BEOL) processing to form one or more metallization layers and/or to interconnect the transistor devices formed, for example. Any other suitable processing may be performed, as will be apparent in light of this disclosure.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
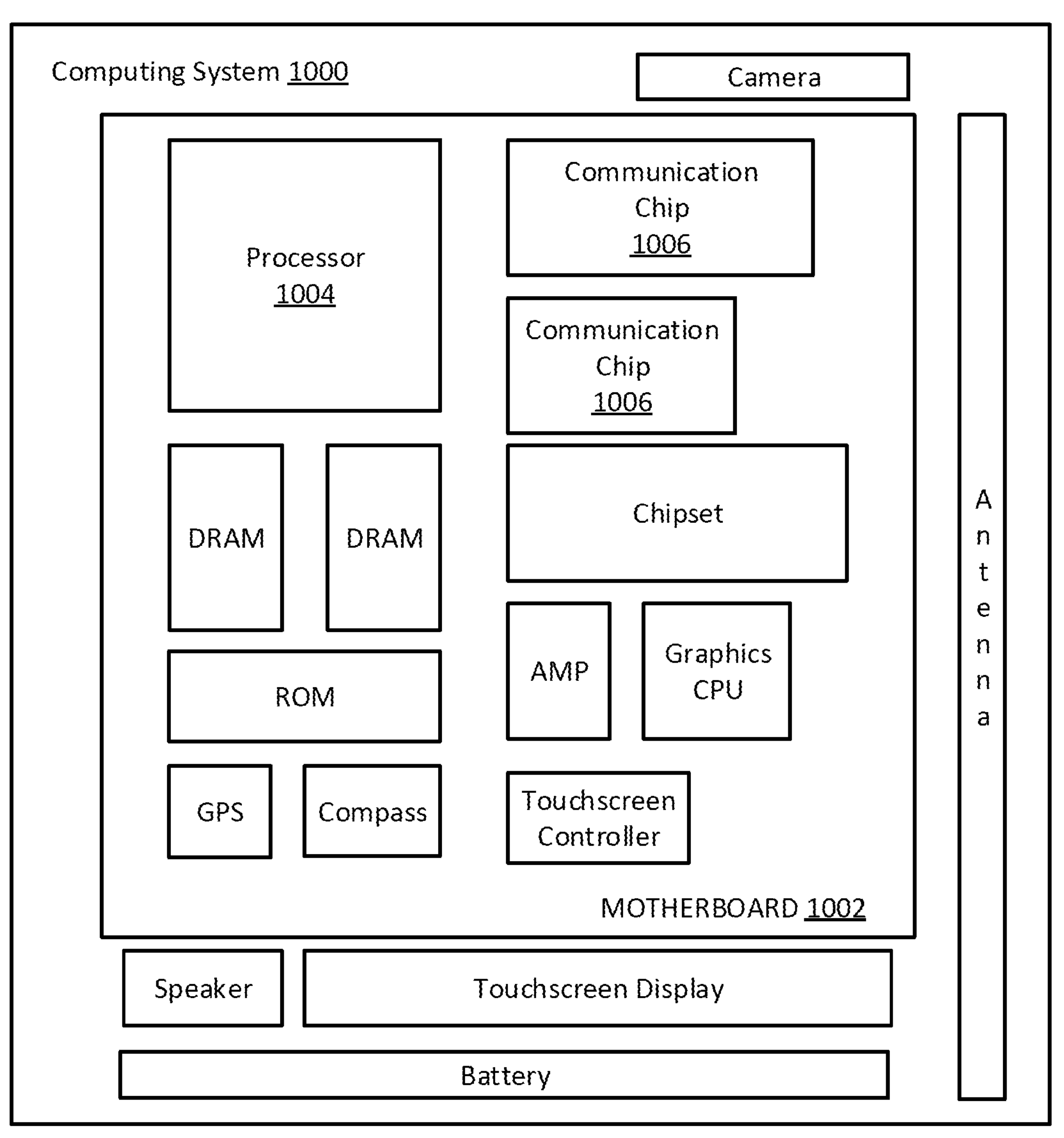
FIG. 4 illustrates a computing system implemented with integrated circuit structures formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit structure, comprising: a vertical stack of devices comprising a first device, and a second device above the first device, wherein the first device comprises (i) a first source region, (ii) a first drain region, (iii) a first body comprising semiconductor material laterally extending from the first source region to the first drain region, (iv) a first source contact coupled to the first source region, the first source contact comprising a first conductive material, and (v) a first drain contact coupled to the first drain region, the first drain contact comprising the first conductive material, and wherein the second device comprises (i) a second source region, (ii) a second drain region, (iii) a second body comprising semiconductor material laterally extending from the second source region to the second drain region, (iv) a second source contact coupled to the second source region, the second source contact comprising a second conductive material, and (v) a second drain contact coupled to the second drain region, the second drain contact comprising the second conductive material, wherein the first conductive material is compositionally different from the second conductive material.

Example 2. The integrated circuit of example 1, wherein the first conductive material comprises a first metal and the second conductive material comprises a second metal elementally different from the first metal.

Example 3. The integrated circuit of any one of examples 1-2, wherein the first source contact and the first second drain contact lack the second conductive material, and wherein the second source contact and the second drain contact lack the first conductive material.

Example 4. The integrated circuit of any one of examples 1-3, wherein the first device is a p-channel metal-oxide semiconductor (PMOS) device and the first conductive material comprises one or both of tungsten and cobalt.

Example 5. The integrated circuit of any one of examples 1-4, wherein the second device is a n-channel metal-oxide semiconductor (NMOS) device and the second conductive material comprises molybdenum.

Example 6. The integrated circuit of any one of examples 1-5, wherein one of the first or second conductive material comprises one or both of tungsten and cobalt, and wherein the other of the first or second conductive material comprises molybdenum.

Example 7. The integrated circuit of any one of examples 1-6, wherein the first conductive material induces one of compressive strain or tensile strain on the first body of the first device, and the second conductive material induces the other of compressive strain or tensile strain on the second body of the second device Example 8. The integrated circuit of any one of examples 1-7, wherein the first conductive material induces compressive strain on the first body of the first device, and the second conductive material induces tensile strain on the second body of the second device.

Example 9. The integrated circuit of any one of examples 1-8, wherein a lateral distance between the first source contact and the first body is in the range of 3-12 nm (nanometers), and wherein a lateral distance between the second source contact and the second body is in the range of 3-12 nm.

Example 10. The integrated circuit of any one of examples 1-9, wherein the first source contact extends within the first source region, and wherein first drain contact extends within the first drain region.

Example 11. The integrated circuit of any one of examples 1-10, wherein the first source contact extends within and through the first source region, such that a bottom surface of the first source contact and a bottom surface of the first source region are coplanar.

Example 12. The integrated circuit of any one of examples 1-11, further comprising: an isolation region between the first source region and the second source region, wherein the first source contact extends within and through the first source region, such that a bottom surface of the first source contact is in contact with the isolation region.

Example 13. The integrated circuit of example 12, wherein a bottom surface of the first source contact is in contact with a top surface of the second source contact.

Example 14. The integrated circuit of any one of examples 12-13, wherein a bottom surface of the first drain contact is in contact with a top surface of the second drain contact.

Example 15. The integrated circuit of any one of examples 1-14, wherein the first source and drain regions comprise one of a p-type or n-type dopant, and the second source and drain regions comprise the other of the p-type or n-type dopant.

Example 16. The integrated circuit of any one of examples 1-15, further comprising: a first gate stack of the first device, the first gate stack wrapped at least in part around the first body; and a second gate stack of the second device, the second gate stack wrapped at least in part around the second body.

Example 17. The integrated circuit of any one of examples 1-16, wherein the first body comprises a first nanoribbon, and the second body comprises a second nanoribbon.

Example 18. An integrated circuit structure comprising: a first transistor device comprising a first source or drain contact coupled to a first source or drain region, the first source or drain contact comprising one or both of tungsten and cobalt; and a second transistor device comprising a second source or drain contact coupled to a second source or drain region, the second source or drain contact comprising molybdenum, wherein the first device and the second device are arranged in a vertical device stack.

Example 19. The integrated circuit structure of example 18, wherein the second device is above the first device in the vertical device stack.

Example 20. The integrated circuit structure of any one of examples 18-19, further comprising: a non-conductive isolation region between (i) the first source or drain contact and (ii) the second source or drain contact.

Example 21. The integrated circuit structure of any one of examples 18-20, wherein a surface of the first source or drain contact is in contact with a surface of the second source or drain contact.

Example 22. The integrated circuit of any one of examples 18-21, wherein the first transistor device and the second transistor device are coupled in a complementary metal oxide semiconductor (CMOS) architecture.

Example 23. The integrated circuit of any one of examples 18-22, wherein the first transistor device and the second transistor device are separated by a non-conductive isolation region.

Example 24. The integrated circuit of any one of examples 18-23, wherein the first transistor device is a p-type MOS (PMOS) device, and the second transistor device is an n-type MOS (NMOS) device.

Example 25. The integrated circuit of any one of examples 18-24, wherein the first source or drain region comprises one of a p-type or n-type dopant, and the second source or drain region comprises the other of the p-type or n-type dopant.

Example 26. The integrated circuit of any one of examples 18-25, wherein the first transistor device further comprises: a third source or drain contact coupled to a third source or drain region, the third source or drain contact comprising one or both of tungsten and cobalt.

Example 27. The integrated circuit of example 26, wherein the first transistor device further comprises: a body comprising semiconductor material laterally extending between the first source or drain region and the third source or drain region; and a gate structure at least partially wrapped around the body.

Example 28. The integrated circuit of any one of examples 18-27, wherein the second transistor device further comprises: a fourth source or drain contact coupled to a fourth source or drain region, the fourth source or drain contact comprising molybdenum.

Example 29. The integrated circuit of example 27, wherein the second transistor device further comprises: a body comprising semiconductor material laterally extending between the second source or drain region and the fourth source or drain region; and a gate structure at least partially wrapped around the body.

Example 30. The integrated circuit of any one of examples 18-29, wherein the first source or drain contact lacks molybdenum.

Example 31. The integrated circuit of any one of examples 18-30, wherein the second source or drain contact lacks one or both of tungsten and cobalt.

Example 32. A processor or memory comprising the integrated circuit of any one of examples 18-31.

Example 33. An integrated circuit structure, comprising: a first device comprising (i) a first source region, (ii) a first drain region, (iii) a first nanoribbon laterally extending from the first source region to the first drain region, and (iv) a first source contact extending within the first source region; and a second device comprising (i) a second source region, (ii) a second drain region, (iii) a second nanoribbon laterally extending from the second source region to the second drain region, and (iv) a second source contact extending within the second source region, wherein the first device and the second device are arranged in a vertical device stack, wherein the first source contact induces compressive strain within the first nanoribbon, and the second source contact induces tensile strain within the second nanoribbon.

Example 34. The integrated circuit of example 33, wherein a lateral distance between the first source contact and the first body is in the range of 3-12 nm (nanometers), and wherein a lateral distance between the second source contact and the second body is in the range of 3-12 nm.

Example 35. The integrated circuit of any one of examples 33-34, wherein: the first device further comprises a first drain contact extending within the first drain region; the second device further comprises a second drain contact extending within the second drain region; and the first drain contact induces compressive strain within the first body, and the second drain contact induces tensile strain within the second body.

Example 36. The integrated circuit of any one of examples 33-35, wherein the first device is a p-channel metal-oxide semiconductor (PMOS) device, and the second device is a n-channel metal-oxide semiconductor (NMOS) device.

Example 37. The integrated circuit of any one of examples 33-36, wherein the second device is above the first device in the vertical device stack.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit, comprising:

a vertical stack of devices comprising a first device, and a second device above the first device, wherein the first device comprises (i) a first source region, (ii) a first drain region, (iii) a first body comprising semiconductor material laterally extending from the first source region to the first drain region, (iv) a first source contact coupled to the first source region, the first source contact comprising a first conductive material, and (v) a first drain contact coupled to the first drain region, the first drain contact comprising the first conductive material, and wherein the second device comprises (i) a second source region, (ii) a second drain region, (iii) a second body comprising semiconductor material laterally extending from the second source region to the second drain region, (iv) a second source contact coupled to the second source region, the second source contact comprising a second conductive material, and (V a second drain contact coupled to the second drain region, the second drain contact comprising the second conductive material, wherein the first conductive material is only a single metal that is elementally different from any metal of the second conductive material, or the first conductive material is a metal alloy that is elementally different from the second conductive material, and wherein a top surface of the first drain contact is in contact with a bottom surface of the second drain contact.

2. The integrated circuit of claim 1, wherein the first device is a p-channel metal-oxide semiconductor (PMOS) device and the first conductive material comprises one or both of tungsten and cobalt.

3. The integrated circuit of claim 1, wherein the second device is a n-channel metal-oxide semiconductor (NMOS) device and the second conductive material comprises molybdenum.

4. The integrated circuit of claim 1, wherein one of the first or second conductive material comprises one or both of tungsten and cobalt, and wherein the other of the first or second conductive material comprises molybdenum.

5. The integrated circuit of claim 1, wherein the first conductive material induces one of compressive strain or tensile strain on the first body of the first device, and the second conductive material induces the other of compressive strain or tensile strain on the second body of the second device.

6. The integrated circuit of claim 1, wherein the first conductive material induces compressive strain on the first body of the first device, and the second conductive material induces tensile strain on the second body of the second device.

7. The integrated circuit of claim 1, wherein a lateral distance between the first source contact and the first body is in the range of 3-12 nm (nanometers), and wherein a lateral distance between the second source contact and the second body is in the range of 3-12 nm.

8. The integrated circuit of claim 1, wherein the first source contact extends within the first source region, and wherein first drain contact extends within the first drain region.

9. The integrated circuit of claim 1, wherein the first source contact extends within and through the first source region, such that a bottom surface of the first source contact and a bottom surface of the first source region are coplanar.

10. The integrated circuit of claim 1, further comprising:

an isolation region between the first source region and the second source region, wherein the first source contact extends within and through the first source region, such that a bottom surface of the first source contact is in contact with the isolation region.

11. The integrated circuit of claim 10, wherein a top surface of the first source contact is in contact with a bottom surface of the second source contact.

12. An integrated circuit structure comprising:

a first transistor device comprising a first source or drain contact coupled to a first source or drain region and a second source or drain contact coupled to a second source or drain region, the first source or drain contact and the second source or drain contact each consisting of tungsten or cobalt; and a second transistor device comprising a third source or drain contact coupled to a third source or drain region and a fourth source or drain contact coupled to a fourth source or drain region, the third source or drain contact and the fourth source or drain contact each consisting of molybdenum, wherein the first device and the second device are arranged in a vertical device stack.

13. The integrated circuit structure of claim 12, wherein the second device is above the first device in the vertical device stack.

14. The integrated circuit structure of claim 12, wherein a surface of the first source or drain contact is in contact with a surface of the second source or drain contact.

15. The integrated circuit structure of claim 12, wherein the first transistor device is a p-type MOS (PMOS) device, and the second transistor device is an n-type MOS (NMOS) device.

16. An integrated circuit, comprising:

a first device comprising (i) a first source region, (ii) a first drain region, (iii) a first nanoribbon laterally extending from the first source region to the first drain region, (iv) a first source contact extending within the first source region, and (v) a first drain contact extending within the first drain region; and a second device comprising (i) a second source region, (ii) a second drain region, (iii) a second nanoribbon laterally extending from the second source region to the second drain region, (iv) a second source contact extending within the second source region, and (v) a second drain contact extending within the second drain region, wherein the first device and the second device are arranged in a vertical device stack, wherein the first source contact and the first drain contact comprise a first conductive material that induces compressive strain within the first nanoribbon, and the second source contact and the second drain contact comprise a second conductive material that induces tensile strain within the second nanoribbon, wherein the first conductive material consists of tungsten or cobalt, and the second conductive material consists of molybdenum.

17. The integrated circuit of claim 16, wherein a lateral distance between the first source contact and the first body is in the range of 3-12 nm (nanometers), and wherein a lateral distance between the second source contact and the second body is in the range of 3-12 nm.

18. The integrated circuit of claim 1, wherein the first conductive material consists of tungsten or cobalt, and the second conductive material consists of molybdenum.

19. The integrated circuit of claim 16, wherein a top surface of the first drain contact is in contact with a bottom surface of the second drain contact.

20. The integrated circuit structure of claim 12, wherein a top surface of the first source or drain contact is in contact with a bottom surface of the third source or drain contact.

* * * * *